(12) United States Patent
Kim et al.

(10) Patent No.: US 11,322,552 B2
(45) Date of Patent: May 3, 2022

(54) DISPLAY APPARATUS

(71) Applicant: LG Display Co., Ltd., Seoul (KR)

(72) Inventors: Minki Kim, Paju-si (KR);
ChoongKeun Yoo, Paju-si (KR);
TaeHan Park, Paju-si (KR); Sul Lee,
Paju-si (KR); Hansun Park, Paju-si
(KR)

(73) Assignee: LG DISPLAY CO., LTD., Seoul (KR)

( * ) Notice: Subject to any disclaimer, the term of this patent is extended or adjusted under 35 U.S.C. 154(b) by 29 days.

(21) Appl. No.: 16/716,856

(22) Filed: Dec. 17, 2019

(65) Prior Publication Data

US 2020/0212111 A1 Jul. 2, 2020

(30) Foreign Application Priority Data

Dec. 27, 2018 (KR) .................. 10-2018-0170490

(51) Int. Cl.
*H01L 27/32* (2006.01)
*H01L 51/52* (2006.01)

(52) U.S. Cl.
CPC ........ *H01L 27/322* (2013.01); *H01L 27/3211* (2013.01); *H01L 27/3246* (2013.01); *H01L 51/5237* (2013.01); *H01L 51/5271* (2013.01); *H01L 51/5275* (2013.01); *H01L 51/5284* (2013.01)

(58) Field of Classification Search
CPC ............. H01L 27/3211; H01L 51/5284; H01L 27/3246; H01L 51/5275; H01L 51/5271; H01L 27/322
See application file for complete search history.

(56) References Cited

U.S. PATENT DOCUMENTS

2018/0026087 A1* 1/2018 Lee .................. H01L 51/5284
257/40
2018/0122868 A1* 5/2018 Kim .................. H01L 51/5237

FOREIGN PATENT DOCUMENTS

KR 10-2018-0026267 A 3/2018

* cited by examiner

*Primary Examiner* — Moazzam Hossain
*Assistant Examiner* — Stanetta D Isaac
(74) *Attorney, Agent, or Firm* — Birch, Stewart, Kolasch & Birch, LLP

(57) ABSTRACT

A display apparatus includes a substrate including a first subpixel and a second subpixel, a first electrode including a first sub-electrode provided in the first subpixel and a second sub-electrode provided in the second subpixel, the first electrode being provided on the substrate, an organic light emitting layer on the first electrode, a second electrode on the organic light emitting layer, a first bank between the first sub-electrode and the second sub-electrode, the first bank dividing the first subpixel and the second subpixel, a color filter layer on the second electrode, a reflective metal at a portion of the color filter layer, and a light absorbing part on an upper surface of the reflective metal, the light absorbing part absorbing light, wherein the first electrode is provided as a reflective electrode, and the organic light emitting layer is disposed between the reflective electrode and the reflective metal.

20 Claims, 18 Drawing Sheets

DISPLAY APPARATUS

CROSS-REFERENCE TO RELATED APPLICATIONS

This application claims the priority benefit of the Korean Patent Application No. 10-2018-0170490 filed in the Republic of Korea on Dec. 27, 2018, which is hereby incorporated by reference as if fully set forth herein.

BACKGROUND

Field of the Invention

The present disclosure relates to a display apparatus for displaying an image.

Discussion of the Related Art

With the advancement of information-oriented society, various requirements for display apparatuses for displaying an image are increasing. Therefore, various display apparatuses such as liquid crystal display (LCD) apparatuses, organic light emitting display apparatuses, micro light emitting display apparatuses, and quantum dot light emitting display apparatuses are being used recently.

Organic light emitting display apparatuses are apparatuses where a light emitting layer is provided between two electrodes (i.e., an anode electrode and a cathode electrode) and emits light with an electric field generated between the two electrodes, thereby displaying an image.

The light emitting layer can emit lights of different colors (for example, red, green, and blue) in subpixels and can emit lights of the same color (for example, white light) in the subpixels. When the light emitting layer is configured to emit white light, a color filter is additionally provided in each subpixel, and thus, each subpixel emits light having a desired color.

A polarizer for blocking external light reflected to eyes of a user is disposed on the light emitting layer. However, when the polarizer is disposed on the light emitting layer, a portion of the light emitted from the light emitting layer is blocked by the polarizer, causing a reduction in emission efficiency. Such a problem is more severe in display apparatuses needing an ultra-high resolution like head-mounted displays.

SUMMARY

Accordingly, the present disclosure is directed to providing a display apparatus that substantially obviates one or more problems due to limitations and disadvantages of the related art.

An aspect of the present disclosure is directed to providing a display apparatus which decreases an external light reflectance and more enhances emission efficiency than a case where a polarizer is installed.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate including a first subpixel and a second subpixel, a first electrode including a first sub-electrode provided in the first subpixel and a second sub-electrode provided in the second subpixel, the first electrode being provided on the substrate, an organic light emitting layer on the first electrode, a second electrode on the organic light emitting layer, a first bank between the first sub-electrode and the second sub-electrode, the first bank dividing the first subpixel and the second subpixel, a color filter layer on the second electrode, a reflective metal at a portion of the color filter layer, and a light absorbing part on an upper surface of the reflective metal, the light absorbing part absorbing light, wherein the first electrode is provided as a reflective electrode, and the organic light emitting layer is disposed between the reflective electrode and the reflective metal.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
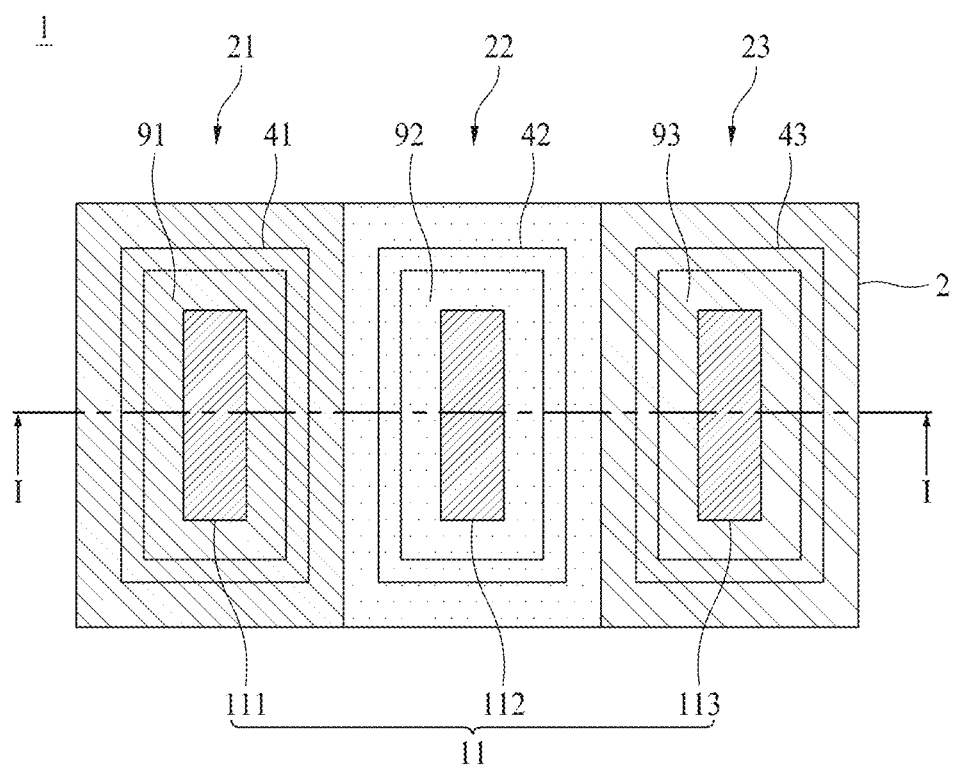
FIG. 1 is a schematic plan view of a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted. In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when a position relation between two parts is described as 'on-', 'over-', 'under-', and 'next-', one or more other parts can be disposed between the two parts unless 'just' or 'direct' is used.

In describing a time relationship, for example, when the temporal order is described as 'after-', 'subsequent-', 'next-', and 'before-', a case which is not continuous can be included unless 'just' or 'direct' is used.

In describing elements of the present disclosure, the terms "first", "second", etc. can be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

In describing the elements of the present disclosure, terms such as first, second, A, B, (a), (b), etc., can be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers can be present. Also, it should be understood that when one element is disposed on or under another element, this can denote a case where the elements are disposed to directly contact each other, but can denote that the elements are disposed without directly contacting each other.

A first horizontal axis direction, a second horizontal axis direction, and a vertical axis direction should not be construed as only a geometric relationship where a relationship therebetween is vertical, and can denote having a broader directionality within a scope where elements of the present disclosure operate functionally.

An X axis direction, a Y axis direction, and a Z axis direction should not be construed as only a geometric relationship where a relationship therebetween is vertical, and can denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of a display apparatus 1 according to the present disclosure will be described in detail with reference to the accompanying drawings. In adding reference numerals to elements of each of the drawings, although the same elements are illustrated in other drawings, like reference numerals can refer to like elements.

Figure 2:
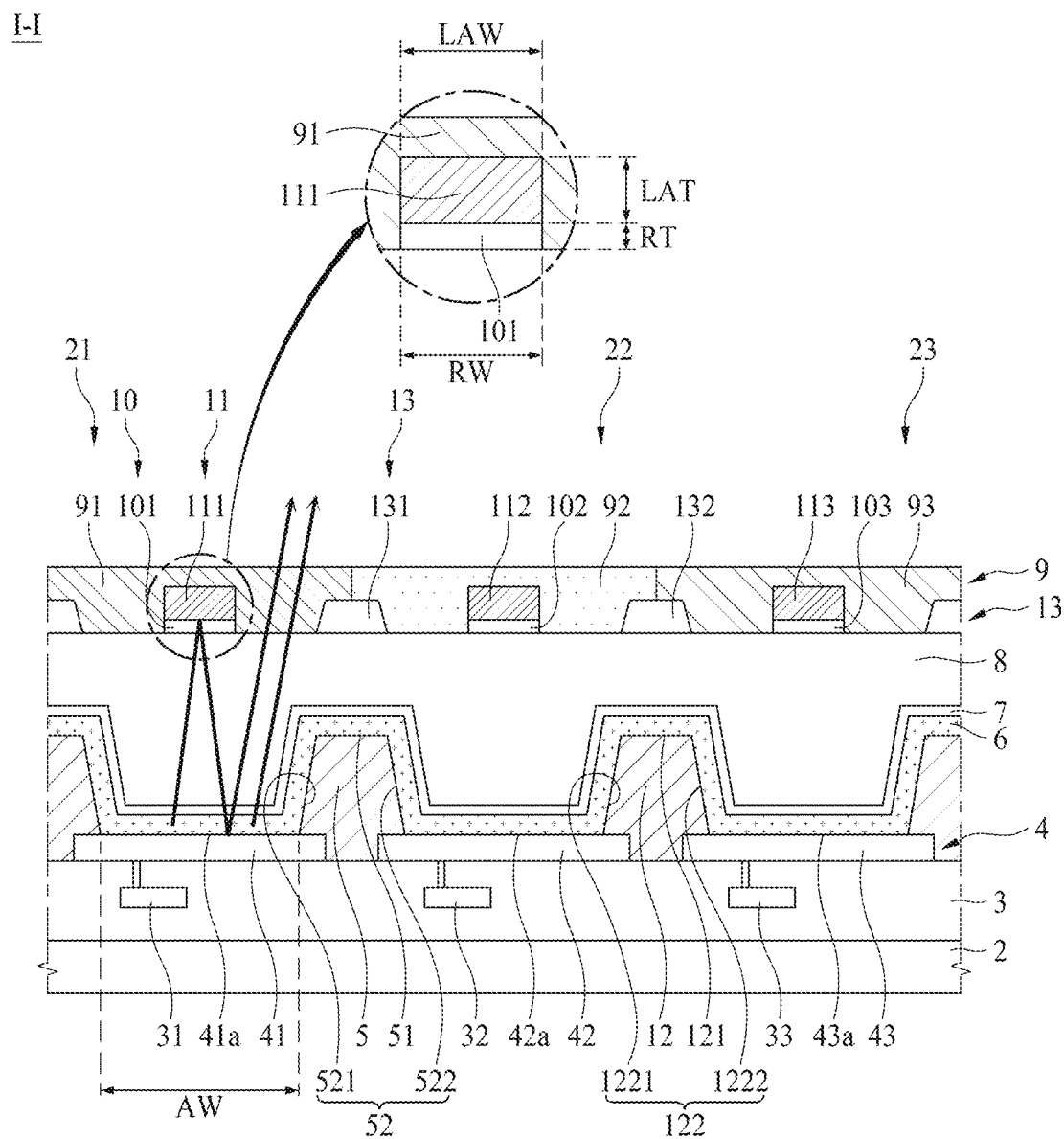
FIG. 2 is a schematic cross-sectional view taken along line I-I illustrated in FIG. 1.

FIG. 1 is a schematic plan view of a display apparatus according to an embodiment of the present disclosure, and FIG. 2 is a schematic cross-sectional view taken along line I-I illustrated in FIG. 1. All the components of the display apparatus according to all embodiments of the present disclosure are operatively coupled and configured.

Referring to FIGS. 1 and 2, the display apparatus 1 according to the present disclosure can include a substrate 2, a circuit device layer 3, a first electrode 4, a first bank 5, an organic light emitting layer 6, a second electrode 7, an encapsulation layer 8, a color filter layer 9, a reflective metal 10, a light absorbing part 11, a second bank 12, and a black matrix 13.

The substrate 2 can be a plastic film, a glass substrate, or a semiconductor substrate such as silicon. The substrate 2 can be formed of a transparent material or an opaque material.

A first subpixel 21, a second subpixel 22, and a third subpixel 23 can be provided on the substrate 2. The second subpixel 22 according to an embodiment can be disposed adjacent to one side of the first subpixel 21. The third subpixel 23 according to an embodiment can be disposed adjacent to one side of the second subpixel 22. Therefore, the first subpixel 21, the second subpixel 22, and the third subpixel 23 can be sequentially arranged on the substrate 2.

The first subpixel 21 can emit red (R) light, the second subpixel 22 can emit green (G) light, and the third subpixel 23 can emit blue (B) light. However, the present disclosure is not limited thereto, and lights of various colors including white can be emitted. Also, the arrangement order of the first to third subpixels 21 to 23 can be variously modified. Also, the display apparatus 1 according to an embodiment of the present disclosure can further include a fourth subpixel. In this case, the fourth subpixel can emit white (W) light.

The first subpixel 21, the second subpixel 22, and the third subpixel 23 can each include the first electrode 4, the organic light emitting layer 6, the second electrode 7, the encapsulation layer 8, the color filter layer 9, the reflective metal 10, and the light absorbing part 11.

The display apparatus 1 according to an embodiment of the present disclosure can be configured as a top emission type where emitted light is discharged in a direction toward an upper portion thereof, and thus, a material of the substrate 2 can use an opaque material as well as a transparent material.

The circuit device layer 3 can be provided on one surface of the substrate 2.

A circuit device including a plurality of thin film transistors (TFTs) 31 to 33, various signal lines, and a capacitor can be provided in each of the first to third subpixels 21 to 23 and in the circuit device layer 3. The signal lines can include a gate line, a data line, a power line, and a reference line, and the TFTs 31 to 33 can include a switching TFT, a driving TFT, and a sensing TFT. The subpixels 21 to 23 can defined by an intersection structure between gate lines, reference voltage lines, power supply lines, and data lines.

The switching TFT can be turned on based on a gate signal supplied through the gate line and can supply the driving TFT with a data voltage supplied through the data line.

The driving TFT can be turned on based on the data voltage supplied through the switching TFT to generate a data current from power supplied through the power line and can supply the data current to the first electrode 4.

The sensing TFT can sense a threshold voltage deviation, which is a cause of the degradation in image quality, of the driving TFT. In response to a sensing control signal supplied through the gate line or a separate sensing line, the sensing TFT can supply a current of the driving TFT to the reference line.

The capacitor can hold the data voltage supplied to the driving TFT during one frame and can be connected to a gate terminal and a source terminal of the driving TFT.

A first thin film transistor 31, a second thin film transistor 32, and a third thin film transistor 33 can be provided in each of the subpixels 21 to 23 and in the circuit device layer 3. The first thin film transistor 31 according to an embodiment can be connected to a first sub-electrode 41 disposed in the first subpixel 21 and can apply, to the first subpixel 21, a driving voltage for emitting light of a corresponding color.

The second thin film transistor 32 according to an embodiment can be connected to a second sub-electrode 42 disposed in the second subpixel 22 and can apply, to the second subpixel 22, a driving voltage for emitting light of a corresponding color.

The third thin film transistor 33 according to an embodiment can be connected to a third sub-electrode 43 disposed in the third subpixel 23 and can apply, to the third subpixel 23, a driving voltage for emitting light of a corresponding color.

When a gate signal is input through the gate line by using a corresponding transistor of the thin film transistors 31 to 33, each of the first subpixel 21, the second subpixel 22, and the third subpixel 23 according to an embodiment can supply a certain current to the organic light emitting layer with a data voltage of the data line. Therefore, the organic light emitting layer of each of the first subpixel 21, the second subpixel 22, and the third subpixel 23 can emit light having certain brightness with the certain current.

The first electrode 4 can be provided on the circuit device layer 3. The first electrode 4 according to an embodiment can be provided as a reflective electrode. The first electrode 4 can include a metal material, which is high in reflectance, such as a stacked structure (Ti/Al/Ti) of aluminum (Al) and titanium (Ti), a stacked structure (ITO/Al/ITO) of Al and indium tin oxide (ITO), an APC alloy, and a stacked structure (ITO/APC/ITO) of an APC alloy and ITO. The APC alloy can be an alloy of silver (Ag), palladium (Pb), and copper (Cu). Therefore, the first electrode 4 can reflect light emitted from the organic light emitting layer 6. The first electrode 4 can be an anode. The first electrode 4 can include the first sub-electrode 41, the second sub-electrode 42, and the third sub-electrode 43.

The first sub-electrode 41 can be provided in the first subpixel 21. The first sub-electrode 41 can be provided in a range from an inner portion to an upper surface of the circuit device layer 3. The first sub-electrode 41 can be connected to a source electrode of the first thin film transistor 31 through a contact hole passing through the circuit device layer 3.

The second sub-electrode 42 can be provided in the second subpixel 22. The second sub-electrode 42 can be provided in a range from the inner portion to the upper surface of the circuit device layer 3. The second sub-electrode 42 can be connected to a source electrode of the second thin film transistor 32 through a contact hole passing through the circuit device layer 3.

The third sub-electrode 43 can be provided in the third subpixel 23. The third sub-electrode 43 can be provided in a range from the inner portion to the upper surface of the circuit device layer 3. The third sub-electrode 43 can be connected to a source electrode of the third thin film transistor 33 through a contact hole passing through the circuit device layer 3.

Here, the first to third thin film transistors 31 to 33 can each be an N-type TFT.

For example, when each of the first to third thin film transistors 31 to 33 is a P-type TFT, the first to third sub-electrodes 41 to 43 can be respectively connected to drain electrodes of the first to third thin film transistors 31 to 33.

That is, each of the first to third sub-electrodes 41 to 43 can be connected to a source electrode or a drain electrode on the basis of a type of each of the first to third thin film transistors 31 to 33.

The display apparatus according to an embodiment of the present disclosure can be configured as the top emission type, and thus, as described above, the first to third sub-electrodes 41 to 43 can each include a reflective material for reflecting light, emitted from the organic light emitting layer 6, to an upper portion. In FIG. 2, each of the first to third sub-electrodes 41 to 43 is illustrated as being provided as a reflective electrode, but is not limited thereto. In other embodiments, each of the first to third sub-electrodes 41 to 43 can be formed in a stacked structure of a transparent electrode including a transparent conductive material and a reflective electrode including the reflective material.

A separate transparent electrode can be additionally provided under the reflective electrode, and thus, each of the first to third sub-electrodes 41 to 43 can be formed in a three-layer structure where the separate transparent electrode, the reflective electrode, and the transparent electrode are sequentially stacked.

In this case, the reflective electrode included in the first subpixel 21, the reflective electrode included in the second subpixel 22, and the reflective electrode included in the third subpixel 23 can all be formed of the same material to have the same thickness.

Likewise, the reflective electrode included in the first subpixel 21, the reflective electrode included in the second subpixel 22, and the reflective electrode included in the third subpixel 23 can all be formed of the same material to have the same thickness. However, the present disclosure is not limited thereto, and thicknesses of the transparent electrodes included in the subpixels 21 to 23 can differ for adjusting a separation distance between the second electrode 7 and each of the sub-electrodes 41 to 43.

Referring again to FIG. 2, the first bank 5 can be provided between the first sub-electrode 41 and the second sub-electrode 42. The first bank 5 according to an embodiment can be for differentiating the first subpixel 21 from the second subpixel 22. The first bank 5 can be provided to cover an edge of each of the first sub-electrode 41 and the second sub-electrode 42, and thus, can differentiate the first subpixel 21 from the second subpixel 22. The first bank 5 can define a subpixel, namely, a light emitting part. Also, a region where the first bank 5 is provided may not emit light, and thus, can be defined as a non-emission part. The first bank 5 can be formed of an organic layer such as acryl resin, epoxy resin, phenolic resin, polyamide resin, or polyimide resin. The organic light emitting layer 6 can be provided on the first electrode 4 and the first bank 5.

The first bank 5 can include an upper surface 51 and an inclined surface 52. The inclined surface 52 can include a first inclined surface 521 and a second inclined surface 522.

The upper surface 51 of the first bank 5 can be a surface disposed at an upper portion of the first bank 5.

The first inclined surface 521 of the first bank 5 can be a surface extending from the upper surface 51 to an upper surface 41a of the first sub-electrode 41. Therefore, the first inclined surface 521 and the upper surface 41a of the first sub-electrode 41 can form a certain angle therebetween. As the display apparatus is implemented at a high resolution, a width of a bank can be narrowed, and thus, the certain angle can be 50 degrees or more and less than 90 degrees. The width of the bank can be narrowed as an interval between adjacent subpixels is narrowed.

The second inclined surface 522 of the first bank 5 can be a surface extending from the upper surface 51 to an upper surface 42a of the second sub-electrode 42. Therefore, the second inclined surface 522 and the upper surface 42a of the second sub-electrode 42 can form a certain angle therebetween. The angle between the second inclined surface 522 and the upper surface 42a of the second sub-electrode 42 can be the same as the angle between the first inclined surface 521 and the upper surface 41a of the first sub-electrode 41.

Referring to FIG. 2, the display apparatus 1 according to an embodiment of the present disclosure can further include a second bank 12.

The second bank 12 can be provided between the second sub-electrode 42 and the third sub-electrode 43. The second bank 12 according to an embodiment can be provided to cover an edge of each of the second sub-electrode 42 and the third sub-electrode 43, and thus, can differentiate the second subpixel 22 from the third subpixel 23. The second bank 12 can define a subpixel, namely, a light emitting part. Also, a region where the second bank 12 is provided may not emit light, and thus, can be defined as a non-emission part. The second bank 12 can be formed of the same material as that of the first bank 5. The organic light emitting layer 6 can be provided on the first electrode 4 and the second bank 12.

The second bank 12 can include an upper surface 121 and an inclined surface 122. The inclined surface 122 can include a first inclined surface 1221 and a second inclined surface 1222.

The upper surface 121 of the second bank 12 can be a surface disposed at an upper portion of the second bank 12.

The second inclined surface 1221 of the second bank 12 can be a surface extending from the upper surface 121 to an upper surface 42a of the second sub-electrode 42. Therefore, the first inclined surface 1221 and the upper surface 42a of the second sub-electrode 42 can form a certain angle therebetween. As the display apparatus is implemented at a high resolution, a width of a bank can be narrowed, and thus, the certain angle can be 50 degrees or more and less than 90 degrees.

The second inclined surface 1222 of the second bank 12 can be a surface extending from the upper surface 121 to an upper surface 43a of the third sub-electrode 43. Therefore, the second inclined surface 1222 and the upper surface 43a of the third sub-electrode 43 can form a certain angle therebetween. The angle between the second inclined surface 1222 and the upper surface 43a of the third sub-electrode 43 can be the same as the angle between the first inclined surface 1221 and the upper surface 42a of the second sub-electrode 42.

The organic light emitting layer 6 can be provided on the first electrode 4, the first bank 5, and the second bank 12. The organic light emitting layer 6 can emit white (W) light. The organic light emitting layer 6 according to an embodiment can include a plurality of stacks which emit lights of different colors. For example, the organic light emitting layer 6 can include a first stack emitting blue (B) light, a second stack emitting yellowish-green (YG) light, and a charge generating layer (CGL) provided between the first stack and the second stack. The first stack can include a first hole transporting layer, a blue light emitting layer, and a first electron transporting layer which are sequentially stacked, and the second stack can include a second hole transporting layer, a yellowish-green light emitting layer, and a second electron transporting layer which are sequentially stacked. In this case, blue light and yellowish-green light can be combined to emit white light. However, the present disclosure is not limited thereto. In other embodiments, the organic light emitting layer 6 can include a first stack emitting red (R) light, a second stack emitting green (G) light, a third stack emitting blue (B) light, a first charge generating layer provided between the first stack and the second stack, and a second charge generating layer provided between the second stack and the third stack, and red light, green light, and blue light can be combined to emit white light.

The organic light emitting layer 6 can be provided as a common layer all over the first to third subpixels 21 to 23. Therefore, as illustrated in FIG. 2, the organic light emitting layer 6 can contact an upper surface of each of the first to third sub-electrodes 41 to 43 which are exposed without being covered by a bank in the subpixels 21 to 23. The organic light emitting layer 6 can be disposed between the first electrode 4 (i.e., a reflective electrode) and the reflective metal 10. Accordingly, a portion of light emitted from the organic light emitting layer 6 can travel to the reflective metal 10 and the reflective electrode.

Since the organic light emitting layer 6 is provided as the common layer, the organic light emitting layer 6 can cover the bank disposed between the subpixels 21 to 23. In more detail, the organic light emitting layer 6 can contact the upper surface 51 and the inclined surface 52 of the first bank 5. A current path between the first subpixel 21 and the second subpixel 22 adjacent to each other is formed to be long and thus a resistance increases, the occurrence of a leakage current can be reduced in the organic light emitting layer 6. Likewise, the organic light emitting layer 6 can contact the upper surface 121 and the inclined surface 122 of the first bank 12, and thus, a current path between the second subpixel 22 and the third subpixel 23 adjacent to each other is formed to be long and thus a resistance increases, whereby the occurrence of a leakage current can be reduced in the organic light emitting layer 6.

When a high-level voltage can be applied to the first electrode 4 and a low-level voltage is applied to the second electrode 7, a hole and an electron can move to a light emitting layer through a hole transporting layer and an electron transporting layer and can be combined in the light emitting layer to emit light.

Referring again to FIG. 2, the second electrode 7 can be disposed on the organic light emitting layer 6. The second electrode 7 according to an embodiment can be a common layer which is provided in the first to third subpixels 21 to 23 in common. The second electrode 7 can be formed of a transparent metal material (or a transparent conductive material (TCO)), such as ITO or indium zinc oxide (IZO) capable of transmitting light, or a semi-transmissive metal material (or a semi-transmissive conductive material) such as magnesium (Mg), Ag, or an alloy of Mg and Ag.

The encapsulation layer 8 can be provided on the second electrode 7. The encapsulation layer 8 can prevent oxygen or water from penetrating into the organic light emitting layer 6 and the second electrode 7. To this end, the encapsulation layer 8 can include at least one inorganic layer and at least one organic layer.

For example, the encapsulation layer 8 can include a first inorganic layer, an organic layer, and a second inorganic layer. In this case, the first inorganic layer can be formed to cover the second electrode 7. The organic layer can be formed to cover the first inorganic layer. The organic layer can be formed to have a sufficient length for preventing particles from penetrating into the organic light emitting layer 6 and the second electrode 7 via the first inorganic layer. The second inorganic layer can be formed to cover the organic layer. The color filter layer 9, the reflective metal 10, the light absorbing part 11, and the black matrix 13 can be disposed on the encapsulation layer 8.

The color filter layer 9 can include a first red color filter (or a first color filter) 91 disposed to correspond to the first subpixel 21, a second green color filter (or a second color filter) 92 disposed to correspond to the second subpixel 22, and a third blue color filter (or a third color filter) 93 disposed to correspond to the third subpixel 23. Therefore, in the first subpixel 21, white light emitted from the organic light emitting layer 6 can pass through the first red color filter 91, and thus, only red light can be transmitted. In the second subpixel 22, the white light emitted from the organic light emitting layer 6 can pass through the second green color filter 92, and thus, only green light can be transmitted. In the third subpixel 23, the white light emitted from the organic light emitting layer 6 can pass through the third blue color filter 93, and thus, only blue light can be transmitted. When the fourth subpixel is provided as described above, a color filter may not be provided in the fourth subpixel, and thus, the white light emitted from the organic light emitting layer 6 can be discharged as is.

The reflective metal 10 can be disposed in the color filter layer 9. In this case, the reflective metal 10 can contact an upper surface of the encapsulation layer 8 and can be disposed on the same line as the black matrix 13. Here, the same line can denote a widthwise-direction axis with respect to FIG. 2. The widthwise-direction axis can be a direction in which the first to third subpixels 21 to 23 are arranged. The reflective metal 10 can be for reflecting light emitted from the organic light emitting layer 6. The reflective metal 10 can be provided to face the first electrode 4. In more detail, the reflective metal 10 can be disposed in parallel with the first electrode 4. Therefore, the reflective metal 10 can reflect light to the first electrode 4 (i.e., a reflective electrode). When the reflective metal 10 is no parallel to the first electrode 4, a reflection angle and a re-reflection angle between the reflective metal 10 and the first electrode 4 can differ, light of the organic light emitting layer 6 may not travel to the color filter layer 9 of a corresponding subpixel but can travel to the color filter layer 9 or the first electrode 4 of an adjacent subpixel, causing color mixture.

The reflective electrode can reflect light, reflected by the reflective metal 10, to the reflective metal 10 or the color filter layer 9. When the light reflected by the reflective electrode is reflected by the reflective metal 10, the reflected light can be reflected to the reflective electrode again, and finally, can be discharged to the outside through the color filter layer 9. That is, the light emitted from the organic light emitting layer 6 can be reflected and re-reflected between the reflective metal 10 and the reflective electrode and can be discharged to the outside through the color filter layer 9.

The reflective metal 10 can be disposed at only a portion of the color filter layer 9. When the reflective metal 10 is disposed on a front surface of the color filter layer 9, there can be no space between the reflective metal 10 and the black matrix 13, and thus, the light of the organic light emitting layer 6 may not be discharged to the outside. Therefore, in the display apparatus 1 according to an embodiment of the present disclosure, since the reflective metal 10 is disposed at only a portion of the color filter layer 9, the light of the organic light emitting layer 6 can be discharged to a space between the reflective metal 10 and the black matrix 13. In this case, as illustrated in FIG. 2, the light discharged to the space between the reflective metal 10 and the black matrix 13 can be light which is generated by a combination of light emitted from the organic light emitting layer 6 and directly discharged to the space and light based on reflection and re-reflection between the reflective metal 10 and the reflective electrode. Therefore, in the display apparatus 1 according to an embodiment of the present disclosure, the reflective metal 10 can cover a portion of the color filter layer 9, but comparing with a case where a polarizer covering a whole surface of the color filter layer is installed, emission efficiency can be enhanced. For example, when it is assumed that emission efficiency is 100% in a case where the polarizer is not installed, emission efficiency is about 50% in a case where the polarizer is installed on the color filter layer, but the emission efficiency of the display apparatus 1 of the present disclosure can be about 67% to 89%.

The reflective metal 10 can include a first reflective metal 101 disposed in the first color filter 91, a second reflective metal 102 disposed in the second color filter 92, and a third reflective metal 103 disposed in the third color filter 93. Therefore, in the first subpixel 21, a portion of white light emitted from the organic light emitting layer 6 can be reflected to the first reflective metal 101, can be re-reflected to the first sub-electrode 41, and can pass through the first color filter 91, and red light can be transmitted. In the second subpixel 22, a portion of the white light emitted from the organic light emitting layer 6 can be reflected to the second reflective metal 102, can be re-reflected to the second sub-electrode 42, and can pass through the second color filter 92, and green light can be transmitted. In the third subpixel 23, a portion of the white light emitted from the organic light emitting layer 6 can be reflected to the third reflective metal 103, can be re-reflected to the third sub-electrode 43, and can pass through the third color filter 93, and blue light can be transmitted. When the fourth subpixel is provided, a portion of the white light emitted from the organic light emitting layer 6 can be reflected to a fourth reflective metal and can be re-reflected to the fourth sub-electrode, and white light can be emitted.

The light absorbing portion 11 can be disposed on an upper surface of the reflective metal 10. The light absorbing portion 11 can include a material for absorbing light and can absorb light (hereinafter referred to as external light) incident on the display apparatus 1 from the outside. Since the light absorbing portion 11 absorbed the external light, dazzling, caused by reflection of the external light, of a user looking at the display apparatus 1 from above the color filter layer 9 can be prevented. That is, in the display apparatus 1 according to an embodiment of the present disclosure, since the light absorbing portion 11 is disposed on the upper surface of the reflective metal 10 disposed in the color filter layer 9, an external light reflectance can be reduced. For example, when it is assumed that an external light reflectance is 100% in a case where the polarizer is not installed, an external light reflectance of the display apparatus 1 can be about 25% to 74%.

The light absorbing portion 11 can be disposed on the upper surface of the reflective metal 10, and thus, can be spaced apart from the encapsulation layer 8. That is, the reflective metal 10 can be disposed between the light absorbing portion 11 and the encapsulation layer 8, light emitted from the organic light emitting layer 6 may not be absorbed by the light absorbing portion 11 but can be reflected by the reflective metal 10.

The light absorbing portion 11 can include a first light absorbing portion/part 111 disposed on an upper surface of a first reflective metal 101, a second light absorbing portion/part 112 disposed on an upper surface of a second reflective metal 102, and a third light absorbing portion/part 113 disposed on an upper surface of a third reflective metal 103. Therefore, the first light absorbing portion 111 can absorb external light incident on the first subpixel 21, the second light absorbing portion 112 can absorb external light incident on the second subpixel 22, and the third light absorbing portion 113 can absorb external light incident on the third subpixel 23. The first, second, and third reflective metal 101, 102 and 103 can also be referred to as first, second and third reflective metal portions/parts, respectively. Further, the reflective metal 10 can be referred to as a reflective metal layer.

Referring to FIG. 2, in the display apparatus 1 according to an embodiment of the present disclosure, the first to third reflective metals 101 to 103 can be spaced apart from one another, and the first to third light absorbing parts 111 to 113 can be spaced apart from one another. Therefore, the light emitted from the organic light emitting layer 6 can be discharged to the outside through a space between the first reflective metal 101 and the second reflective metal 102 and a space between the first light absorbing part 111 and the second light absorbing part 112. Likewise, the light emitted from the organic light emitting layer 6 can be discharged to the outside through a space between the second reflective metal 102 and the third reflective metal 103 and a space between the second light absorbing part 112 and the third light absorbing part 113.

The black matrix 13 can be provided on the encapsulation layer 8. In this case, as described above, the black matrix 13 can be disposed on the same line as that reflective metal 10. The black matrix 13 can be for preventing color mixture between adjacent subpixels. In more detail, the black matrix 13 can include a material for absorbing light, and thus, light emitted from each subpixel can be prevented from interfering with an adjacent subpixel, thereby preventing color mixture.

The black matrix 13 can include a first black matrix 131 and a second black matrix 132. The first black matrix 131 can be disposed to correspond to the first bank 5, and the second black matrix 132 can be disposed to correspond to the second bank 12. Therefore, the first black matrix 131 can be disposed at a position corresponding to the first bank 5 (i.e., between the first color filter 91 and the second color filter 92), and thus, can prevent color mixture from occurring between the first subpixel 21 and the second subpixel 22. The second black matrix 132 can be disposed at a position corresponding to the second bank 12 (i.e., between the second color filter 92 and the third color filter 93), and thus, can prevent color mixture from occurring between the second subpixel 22 and the third subpixel 23.

Due to the first to third color filters 91 to 93 which have different colors and are disposed on the encapsulation layer 8, colors of lights emitted from the first to third subpixels 21 to 23 can differ, and moreover, the first to third subpixels 21 to 23 can have the same structure and shape. Hereinafter, therefore, only the first subpixel 21 will be described.

Referring to FIG. 2, a width LAW of the first light absorbing part 111 disposed in the first subpixel 21 can be the same as a width RW of the first reflective metal 101. When the width RW of the first reflective metal 101 is less than the width LAW of the first light absorbing part 111, a portion of light incident on the display apparatus 1 can be reflected to the first reflective metal 101 uncovered by the first light absorbing part 111, causing dazzling of a user. When the width LAW of the first light absorbing part 111 is greater than the width RW of the first reflective metal 101, a portion of the light emitted from the organic light emitting layer 6 can be absorbed by the first light absorbing part 111 uncovered by the first reflective metal 101, causing a problem where luminance is reduced. Accordingly, in the display apparatus 1 according to an embodiment of the present disclosure, the width LAW of the first light absorbing part 111 can be the same as the width RW of the first reflective metal 101, an external light reflectance can be reduced, and comparing with a case where the polarizer is installed as described above, emission efficiency can be enhanced.

The width RW of the first reflective metal 101 can be less than a width AW of the first sub-electrode 41 contacting the organic light emitting layer 6. When the width RW of the first reflective metal 101 is equal to or greater than the width AW of the first sub-electrode 41 contacting the organic light emitting layer 6, a separation interval between the first reflective metal 101 and the first black matrix 131 can be narrowed, and due to this, the amount of light of the organic light emitting layer 6 discharged through the separation interval can be reduced, causing a reduction in luminance. Accordingly, in the display apparatus 1 according to an embodiment of the present disclosure, since the width RW of the first reflective metal 101 is set to be less than the width AW of the first sub-electrode 41 contacting the organic light emitting layer 6, emission efficiency can be enhanced compared to a case where a polarizer is installed.

A thickness RT of the first reflective metal 101 can be set to be thinner than a thickness LAT of the first light absorbing part 111. When the thickness RT of the first reflective metal 101 is set to be equal to or thicker than the thickness LAT of the first light absorbing part 111, external light incident on the display apparatus 1 can be reflected to a side surface of the first reflective metal 101, and thus, a light path can be changed to the second subpixel 22 adjacent thereto. In this case, light can be reflected to the second sub-electrode 42 and can be discharged to the second color filter 92, and due to this, there can be a problem where light is emitted from the second subpixel 22 even when the organic light emitting layer 6 does not emit light. Therefore, in the display apparatus 1 according to an embodiment of the present disclosure, the thickness RT of the first reflective metal 101 can be set to be thinner than the thickness LAT of the first light absorbing part 111, thereby solving a problem where light of an undesired color is emitted. For example, the thickness RT of the first reflective metal 101 can be set to 50 nm to 150 nm, and the thickness LAT of the first light absorbing part 111 can be set to 1,000 nm to 2,000 nm.

When the thickness RT of the first reflective metal 101 is set to less than 50 nm, a thickness can be excessively thinned, and due to this, the light emitted from the organic light emitting layer 6 can be transmitted without being reflected and can be absorbed by the first light absorbing part 111, causing a reduction in emission efficiency. When the thickness RT of the first reflective metal 101 is set to more than 150 nm, a problem where light of an undesired color is emitted can occur, and moreover, a problem where a total thickness of the display apparatus 1 is thickened can occur.

When the thickness LAT of the first light absorbing part 111 is set to less than 1,000 nm, there can be a problem where an external light absorption rate is reduced, and when the thickness LAT of the first light absorbing part 111 is set to more than 2,000 nm, a problem where the total thickness of the display apparatus 1 is thickened can occur.

Referring again to FIG. 2, the first color filter 91 can be provided to cover the first light absorbing part 111 and the first reflective metal 101. However, the present disclosure is not limited thereto, and the first color filter 91 can be provided to cover a side surface of the first light absorbing part 111 and a side surface of the first reflective metal 101. That is, the first color filter 91 can be disposed on the same line as the first light absorbing part 111. In this case, however, a process of removing the first color filter 91 can be added so that the first color filter 91 matches the upper surface of the first light absorbing part 111, and moreover, a process of removing the first color filter 91 to match the upper surface of the first light absorbing part 111 may not be easy. Accordingly, in the display apparatus 1 according to an embodiment of the present disclosure, the first color filter 91 can be provided to cover the first light absorbing part 111 and the first reflective metal 101, and thus, comparing with a case where an upper surface of the first color filter 91 matches the upper surface of the first light absorbing part 111, the number of manufacturing processes can decrease and manufacturing can be easily performed.

The display apparatus 1 according to an embodiment of the present disclosure can be implemented so that a ratio of an area occupied by the first light absorbing part 111 in the first color filter 91 is 25% to 75%. When a ratio of an area occupied by the first light absorbing part 111 in the first color filter 91 is less than 25%, the amount of external light absorbed by the first light absorbing part 111 can be excessively reduced, causing a reduction in external light reflectance. On the other hand, when a ratio of an area occupied by the first light absorbing part 111 in the first color filter 91 is more than 75%, the amount of external light absorbed by the first light absorbing part 111 can increase, but the light emitted from the organic light emitting layer 6 can be blocked by the first light absorbing part 111, causing a reduction in emission efficiency. Accordingly, since the display apparatus 1 according to an embodiment of the present disclosure is implemented so that a ratio of an area occupied by the first light absorbing part 111 in the first color filter 91 is 25% to 75%, an external light reflectance can be prevented from decreasing, and comparing with a case where a polarizer is installed, emission efficiency can be enhanced.

In more detail, in the display apparatus 1 according to an embodiment of the present disclosure, when a ratio of an area occupied by the first light absorbing part 111 in the first color filter 91 is 25%, an external light reflectance can be 74% and emission efficiency can be 89% compared to a case where a polarizer is installed. When a ratio of an area occupied by the first light absorbing part 111 in the first color filter 91 is 49%, an external light reflectance can be 52% and emission efficiency can be 78% compared to a display apparatus where the polarizer is installed. When a ratio of an area occupied by the first light absorbing part 111 in the first color filter 91 is 75%, an external light reflectance can be 25% and emission efficiency can be 67% compared to the display apparatus where the polarizer is installed. In the display apparatus where the polarizer is installed, an external light reflectance can decrease by 50%, but emission efficiency can decrease by 50%. As a result, in the display apparatus 1 according to an embodiment of the present disclosure, when a ratio of an area occupied by the first light absorbing part 111 in the first color filter 91 is 49%, an external light reflectance can be almost equal but emission efficiency can be enhanced compared to the display apparatus where the polarizer is installed.

Figure 3A:
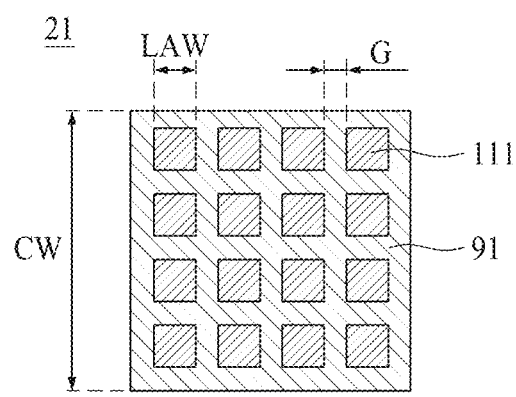
FIGS. 3A to 3C are schematic plan views illustrating various examples of a light absorbing part disposed in a first subpixel illustrated in FIG. 1.
Figure 3B:
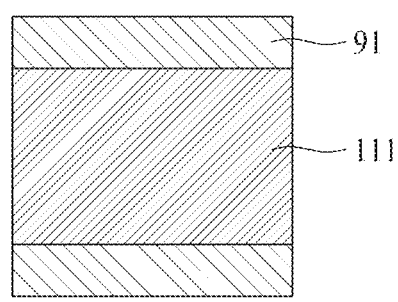
Figure 3C:
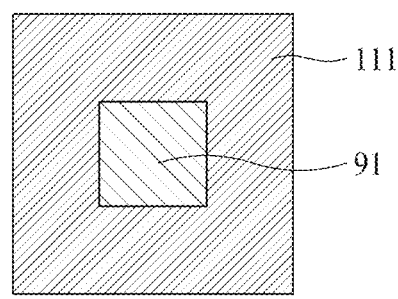
Figure 3D:
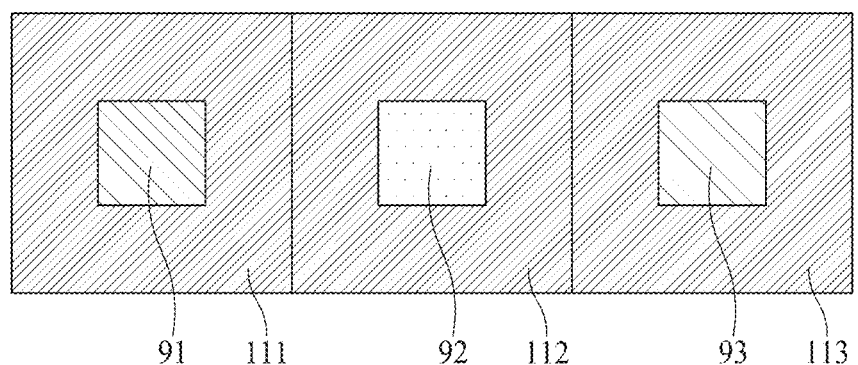
FIG. 3D is a schematic plan view illustrating another example of a light absorbing part disposed in each of first to third subpixels illustrated in FIG. 1.

FIGS. 3A to 3C are schematic plan views illustrating various examples of a light absorbing part disposed in a first subpixel illustrated in FIG. 1, and FIG. 3D is a schematic plan view illustrating another example of a light absorbing part disposed in each of first to third subpixels illustrated in FIG. 1.

FIG. 3A illustrates an example where N (where N is an integer more than zero) or more first light absorbing parts 111 are provided in the first color filter 91 disposed in the first subpixel 21. In FIG. 3A, an example where the first color filter 91 is formed in a square shape is illustrated, and a width CW of the first color filter 91 can be about 100 μm. Here, a plurality of first light absorbing parts 111 can be formed in a square shape where a width W is about 10 μm and can be arranged at intervals G of about 3.75 μm. As illustrated in FIG. 3A, the plurality of first absorbing parts 111 can be distributed and disposed on a whole surface of the first color filter 91, and thus, an external light absorption rate can be more enhanced than a case where the number of first light absorbing parts 111 is one. Also, the plurality of first light absorbing parts 111 can be disposed apart from one another, and thus, comparing with a case where one first light absorbing part 111 is disposed in a center region of the first color filter 91, a space to which light emitted from the organic light emitting layer 6 is discharged can be provided in the center region, thereby more enhancing emission efficiency. In FIG. 3A, an example where a width W of each of the plurality of first light absorbing parts 111 is about 10 μm and a separation interval G between adjacent first light absorbing parts 111 is about 3.75 μm is illustrated, but the present disclosure is not limited thereto. In other examples, the width W of each of the plurality of first light absorbing parts 111 and the separation interval G between adjacent first light absorbing parts 111 can vary based on a ratio of an area occupied by the first light absorbing part 111 in the first color filter 91.

FIG. 3B illustrates another example where one first light absorbing part 111 is provided in the first color filter 91. As illustrated in FIG. 3B, the first light absorbing part 111 can divide the first color filter 91 into two. Therefore, with respect to FIG. 3B, the light emitted from the organic light emitting layer 6 can be discharged through the first color filter 91 disposed on and under the first light absorbing part 111. When the second and third subpixels 22 and 23 are provided in a structure illustrated in FIG. 3, the first light absorbing part 111 can be connected to the second light absorbing part 112 of the second subpixel 22 adjacent thereto, and the second light absorbing part 112 of the second subpixel 22 can be connected to the third light absorbing part 113 of the third subpixel 23 adjacent thereto. That is, the first to third light absorbing parts 111 to 113 can be provided as one stripe type. When the first to third light absorbing parts 111 to 113 are provided as one stripe type, the number of manufacturing processes can decrease and manufacturing can be easily performed compared to a case where the first to third light absorbing parts 111 to 113 are provided in each of the subpixels 21 to 23.

FIG. 3C illustrates another example where the first light absorbing part 111 is provided at an edge of the first color filter 91. Therefore, as illustrated in FIG. 3C, as seen from a plane, the first color filter 91 can be seen as being disposed in the first light absorbing part 111. When the first light absorbing part 111 is disposed as in FIG. 3C, the light emitted from the organic light emitting layer 6 can be discharged to the outside through the first color filter 91 disposed in the first light absorbing part 111. When the second and third subpixels 22 and 23 are provided in a structure illustrated in FIG. 3C, the first light absorbing part 111 of the first subpixel 21, the second light absorbing part 112 of the second subpixel 22, and the third light absorbing part 113 of the third subpixel 23 can be connected to one another. In this case, the first to third light absorbing parts 111 to 113 can be disposed between the subpixels 21 to 23 adjacent to one another, and thus, can effectively prevent color mixture from occurring between the adjacent subpixels 21 to 23 compared to FIGS. 3A and 3B.

Features of the reflective metal 101 and the light absorbing part 111 each disposed in the first subpixel 21 described above with reference to FIGS. 1 to 3C can be identically applied to the reflective metal 102 and the light absorbing part 112 each disposed in the second subpixel 22 and the reflective metal 103 and the light absorbing part 113 each disposed in the third subpixel 23.

Referring to FIG. 3D, the display apparatus 1 according to an embodiment of the present disclosure can be provided so that the first to third reflective metals 101 to 103 are connected to one another and the first to third light absorbing parts 111 to 113 are connected to one another. In this case, a hole through which light of the organic light emitting layer 6 is discharged can be provided in each of the first reflective metal 101 and the first light absorbing part 111, the second reflective metal 102 and the second light absorbing part 112, and the third reflective metal 103 and the third light absorbing part 113. The color filters 91 to 93 corresponding to each of the subpixels 21 to 23 can be filled into the hole.

Figure 3E:
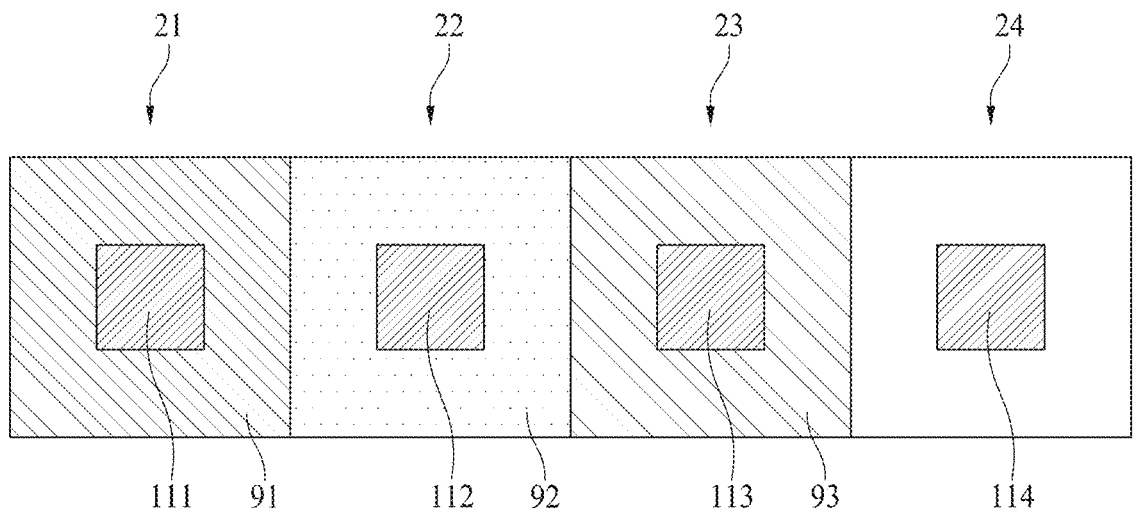
FIGS. 3E to 3G are schematic plan views illustrating various examples of one pixel configured by a combination of modified examples of FIGS. 3A to 3C.
Figure 3F:
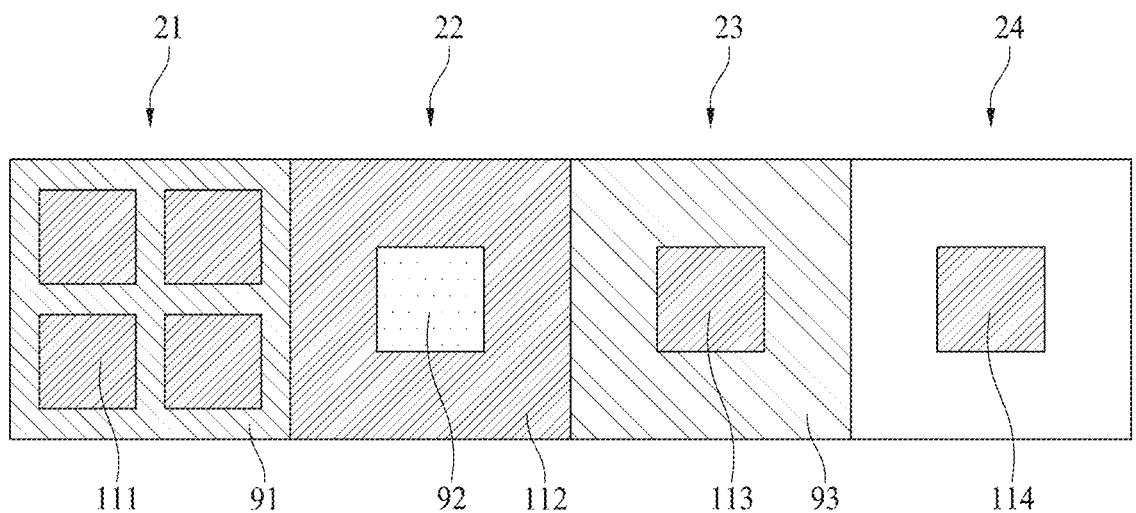
Figure 3G:
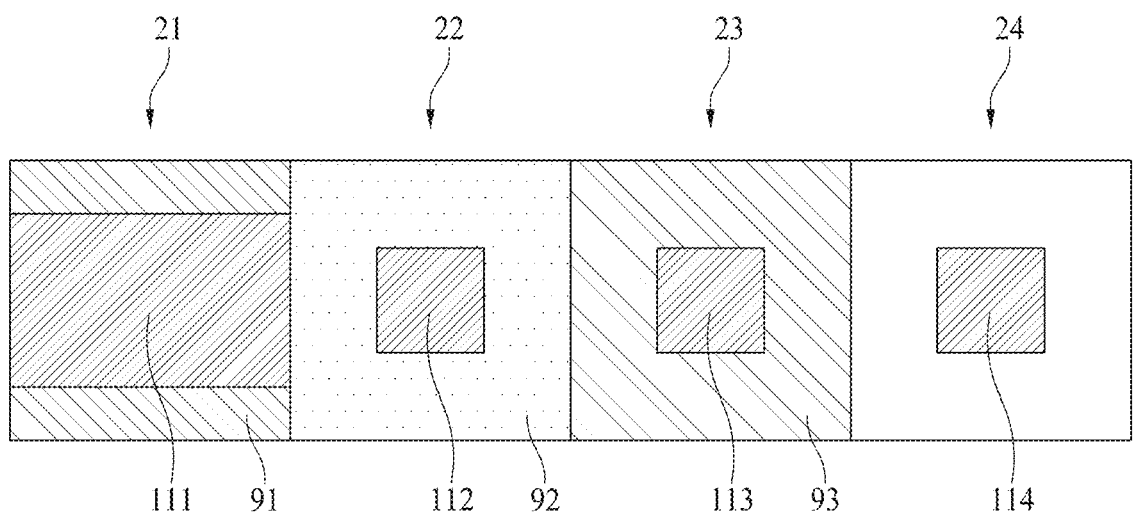

FIGS. 3E to 3G are schematic plan views illustrating various examples of one pixel configured by a combination of modified examples of FIGS. 3A to 3C.

Referring to FIGS. 3E to 3G, one pixel can include a first subpixel 21, a second subpixel 22, a third subpixel 23, and a fourth subpixel 24. The first subpixel 21 can be provided to emit red light, the second subpixel 22 can be provided to emit green light, the third subpixel 23 can be provided to emit blue light, and the fourth subpixel 24 can be provided to emit white light.

First, referring to FIG. 3E, a first light absorbing part 111 can be disposed at a center portion of a first subpixel 21, and a first red color filter 91 can be disposed outside the first light absorbing part 111. A second light absorbing part 112 can be disposed at a center portion of a second subpixel 22, and a second green color filter 92 can be disposed outside the second light absorbing part 112. A third light absorbing part 113 can be disposed at a center portion of a third subpixel 23, and a third blue color filter 93 can be disposed outside the third light absorbing part 113. A fourth light absorbing part 114 can be disposed at a center portion of a fourth subpixel 24, and a color filter may not be disposed outside the fourth light absorbing part 114. This is because the fourth subpixel 24 emits white light. The first to fourth light absorbing parts 111 to 114 can each include a material for absorbing light.

As in FIG. 3E, when an area of each of the first to fourth light absorbing parts 111 to 114 is set to be equal, areas occupied by the first to fourth light absorbing parts 111 to 114 in respective areas of the first to fourth subpixels 21 to 24 can be the same, and thus, an external light reflectance can be almost equal and emission efficiency can be almost equal. For example, when an area of the first subpixel 21 (i.e., an area occupied by the first light absorbing part 111 with respect to an area of the first color filter 91) is 49%, as described above, an external light reflectance can be 52%, and emission efficiency can be 78%. This can be almost identically obtained in the second to fourth subpixels 22 to 24.

In FIG. 3E, the first to fourth light absorbing parts 111 to 114 are illustrated as having the same area, but are not limited thereto. In other embodiments, the first to fourth light absorbing parts 111 to 114 can be provided to have different sizes, and in this case, subpixels can have different external light reflectance and emission efficiency.

Referring to FIG. 3F, a plurality of first light absorbing parts 111 can be disposed at a center portion of a first subpixel 21, and a first red color filter 91 can be disposed outside each of the first light absorbing parts 111. On the other hand, a second color filter 92 can be disposed at a center portion of a second subpixel 22, and a second light absorbing part 112 can be disposed outside the second color filter 92. That is, the first subpixel 21 and the second subpixel 22 can be a type where a color filter and a light absorbing part is inverted. A third light absorbing part 113 can be disposed at a center portion of a third subpixel 23, and a third blue color filter 93 can be disposed outside the third light absorbing part 113. A fourth light absorbing part 114 can be disposed at a center portion of a fourth subpixel 24, and a color filter may not be disposed outside the fourth light absorbing part 114. As in FIG. 3E, a color filter may not be disposed because the fourth subpixel 24 emits white light.

As illustrated in FIG. 3F, like FIG. 3E, one pixel can include first to fourth subpixels 21 to 24. However, in FIG. 3F, a pattern of the first light absorbing part 111 provided in the first subpixel 21, a pattern of the second light absorbing part 112 provided in the second subpixel 22, and a pattern of the third light absorbing part 113 provided in the third subpixel 23 can differ. In more detail, a light absorbing part and a color filter can be provided as an inverted type in each of the first subpixel 21 and the second subpixel 22, the first light absorbing part 111 can be provided in plurality in the first subpixel 21, and the second light absorbing part 112 can be provided as one in the second subpixel 22. When implemented as in FIG. 3F, an external light reflectance and emission efficiency in the first subpixel 21 can differ from an external light reflectance and emission efficiency in the second subpixel 22, based on comparison of an area occupied by the first light absorbing part 111 in the first subpixel 21 and an area occupied by the second light absorbing part 112 in the second subpixel 22.

For example, when an area occupied by the first light absorbing part 111 in the first subpixel 21 is less than an area occupied by the second light absorbing part 112 in the second subpixel 22, an external light reflectance in the first subpixel 21 can be greater than an external light reflectance in the second subpixel 22, and emission efficiency in the first subpixel 21 can be greater than emission efficiency in the second subpixel 22.

The plurality of first light absorbing parts 111 can be disposed apart from one another in the first subpixel 21, and the first color filter 91 can be disposed between the first light absorbing parts 111, whereby light emitted from the first subpixel 21 can be discharged to the outside through the first color filter 91 disposed between the first light absorbing parts 111. Therefore, as in FIG. 3F, the first subpixel 21 where the plurality of first light absorbing parts 111 are disposed apart from one another can have emission efficiency which is greater than emission efficiency in a subpixel where one light absorbing part is provided without a plurality of light absorbing parts disposed apart from one another.

Referring again to FIG. 3F, since a light absorbing part and a color filter are provided as an inverted type in each of the second subpixel 22 and the third subpixel 23, an area of the second light absorbing part 112 disposed in the second subpixel 22 can be greater than an area of the third light absorbing part 113 disposed in the third subpixel 23. Accordingly, an external light reflectance in the third subpixel 23 can be greater than an external light reflectance in the second subpixel 22, and emission efficiency in the third subpixel 23 can be greater than emission efficiency in the second subpixel 22.

Moreover, the third subpixel 23 and the fourth subpixel 24 can be provided as the same type, and thus, an external light reflectance and emission efficiency can be almost similarly obtained.

Referring to FIG. 3G, in a first subpixel 21, a first light absorbing part 111 can be disposed as a stripe type across a center of the first subpixel 21, and a first red color filter 91 can be disposed adjacent to each of both sides of the first light absorbing part 111. In a second subpixel 22, a second light absorbing part 112 can be disposed at a center of the second subpixel 22, and a second green color filter 92 can be disposed outside the second light absorbing part 112. In a second subpixel 23, a third light absorbing part 113 can be disposed at a center of the third subpixel 23, and a third green color filter 93 can be disposed outside the third light absorbing part 113. Also, in a fourth subpixel 24, a fourth light absorbing part 114 can be disposed at a center portion of the fourth subpixel 24, and a color filter may not be disposed outside the fourth light absorbing part 114.

In FIG. 3G, except for the first subpixel 21, the second to fourth subpixels 22 to 24 can be provided as the same type, and thus, an external light reflectance and emission efficiency can be almost similarly obtained in the second to fourth subpixels 22 to 24.

Therefore, comparing the first subpixel 21 with the second subpixel 22, it can be seen that an area of the first light absorbing part 111 disposed in the first subpixel 21 is greater than that of the second light absorbing part 112 disposed in the second subpixel 22. Therefore, an external light reflectance in the second subpixel 22 can be greater than an external light reflectance in the first subpixel 21, and emission efficiency in the second subpixel 23 can be greater than emission efficiency in the second subpixel 22.

As a result, the display apparatus 1 according to an embodiment of the present disclosure can be provided so that the first to fourth subpixels 21 to 24 are provided as the same type in one pixel as in FIG. 3D, and thus, an external light reflectance and emission efficiency are almost identically obtained in each subpixel. However, the present disclosure is not limited thereto, and as illustrated in FIGS. 3E to 3G, one pixel can include the first to fourth subpixels 21 to 24 including various types light absorbing parts. That is, a shape and an area ratio each occupied by a light absorbing part can differ in each subpixel, and thus, an external light reflectance and emission efficiency can be differently obtained in each subpixel.

Figure 4A:
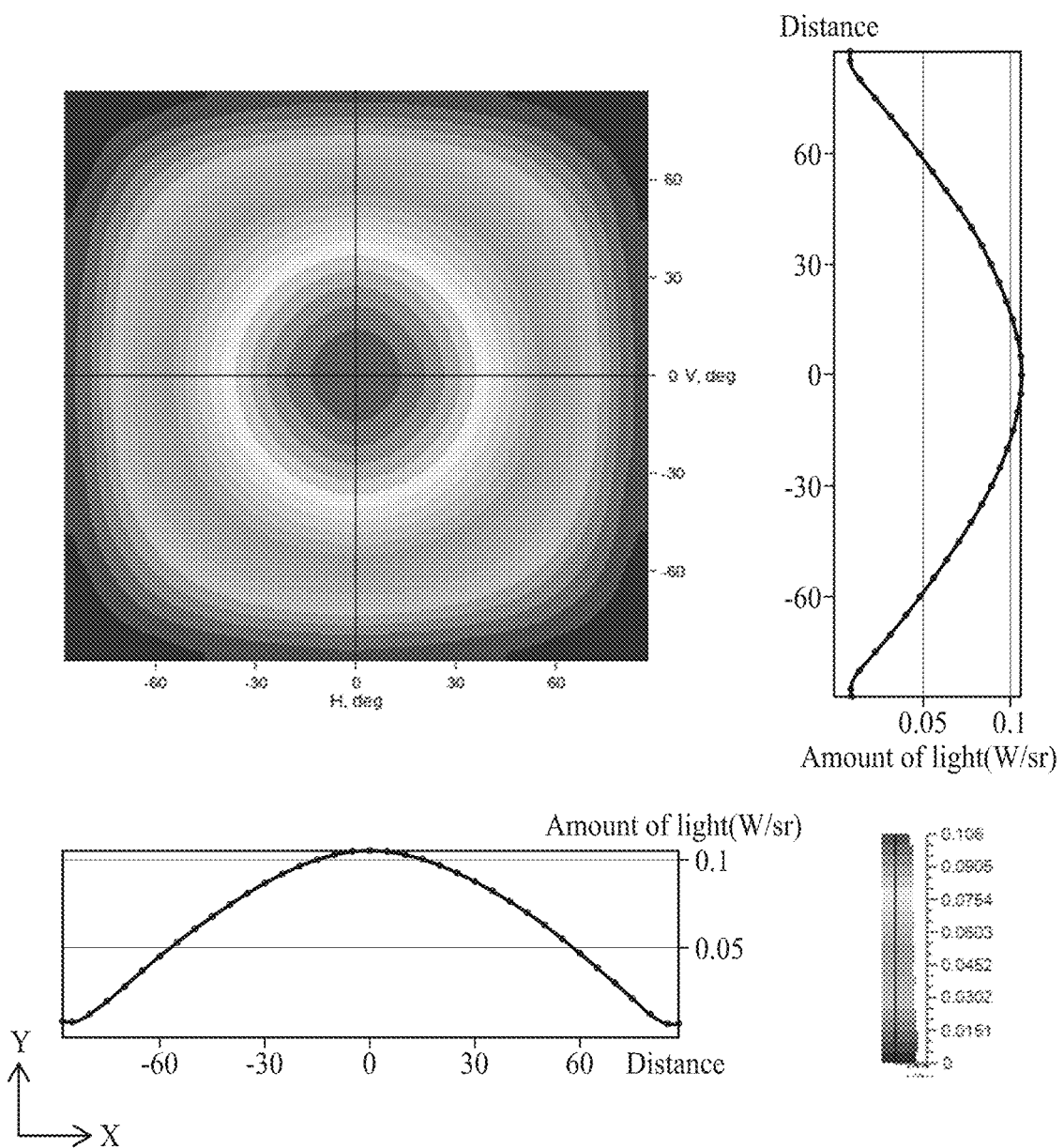
FIG. 4A is a diagram illustrating a light distribution of light emitted from one subpixel in a display apparatus where a polarizer is installed according to a related art.

Moreover, when a light absorbing part is disposed at a center of a subpixel and an area occupied by the light absorbing part is the same, emission efficiency can be greater in a case, where one light absorbing part is provided, than a case where a plurality of light absorbing parts are provided apart from one another. This is because, when one light absorbing part is provided, light can be discharged to the outside through only a side surface of the light absorbing part, and when a plurality of light absorbing parts are provided apart from one another, light can be discharged to the outside through a space between the light absorbing parts. FIG. 4A is a diagram showing a light distribution of light emitted from one subpixel according to a related art, and FIG. 4B is a diagram showing a light distribution of light emitted from the first subpixel illustrated in FIG. 1.

Figure 4B:
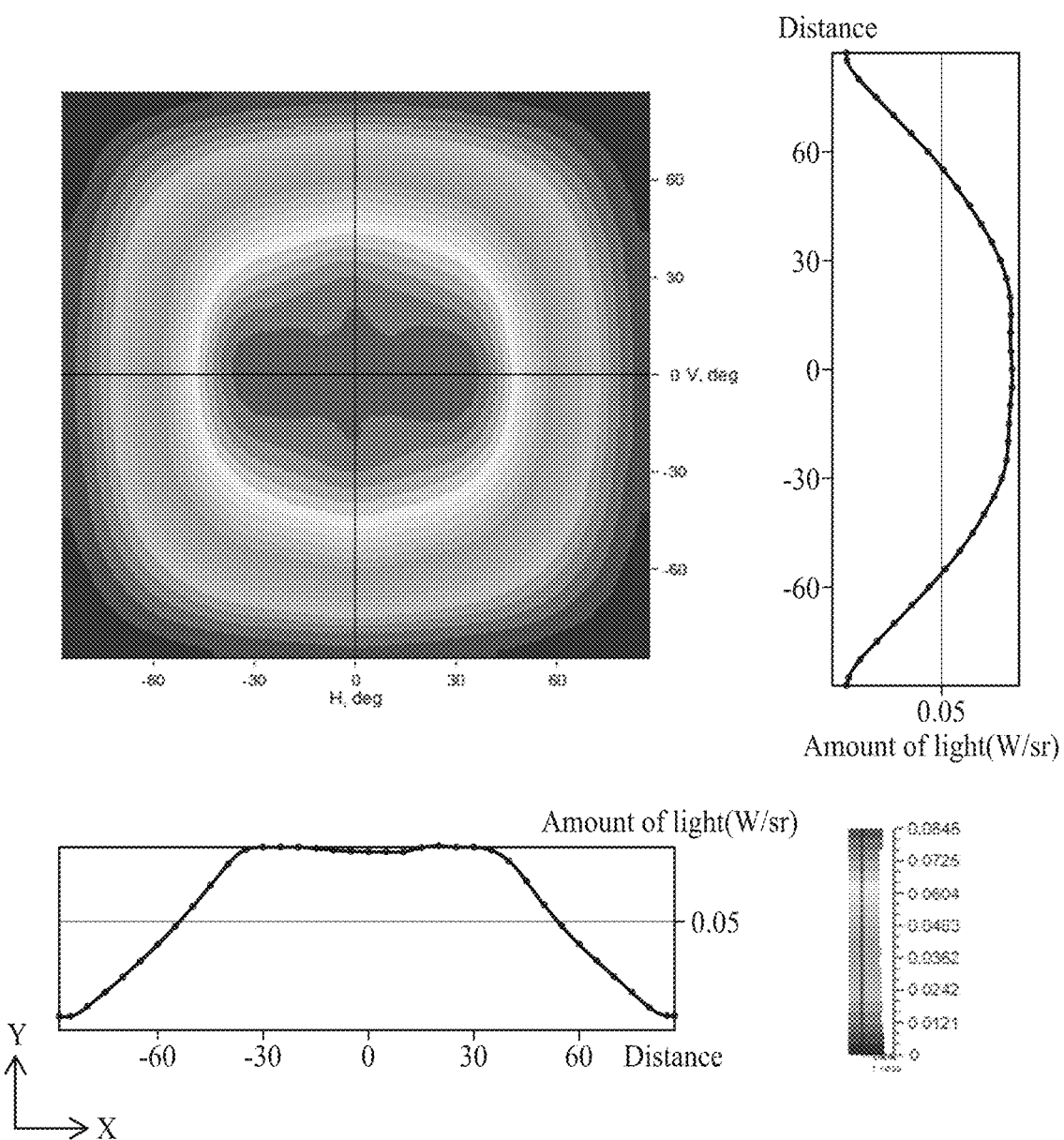
FIG. 4B is a diagram illustrating a light distribution of light emitted from a first subpixel illustrated in FIG. 1.

In a light distribution diagram of each of FIGS. 4A and 4B, an X-axis direction and a Y-axis direction represent a distance apart from a center of emission, and a color represents the amount of light. The amount of light is reduced in a direction from red to blue. Graphs shown at an upper side and a side of the light distribution diagram are cross-sectional views taken along an X-axis direction and a Y-axis direction in a light distribution diagram of a display apparatus where a polarizer is installed.

FIG. 4A shows a light distribution diagram of light emitted from one subpixel in a display apparatus where a polarizer is installed according to the related art. As shown in FIG. 4A, in the display apparatus where the polarizer is installed, a center of emission has red, and portions progressively closer to an edge have the amount of yellow light, the amount of green light, and the amount of blue light. In the display apparatus where the polarizer is installed, as seen from a plane, a red region (i.e., a center of emission) can be formed in an approximately circular shape. Referring to graphs shown at an upper side and a side of the light distribution diagram of FIG. 4A, the display apparatus where the polarizer is installed has a light distribution diagram having a bell shape, and the red region which is the center of emission can be formed between −10 and 10.

On the other hand, the display apparatus 1 of the present disclosure of FIG. 4B is similar in that a center of emission has red and portions progressively closer to an edge have the amount of yellow light, the amount of green light, and the amount of blue light. However, since the reflective metal 10 and the light absorbing part 11 are disposed at a center of a color filter as illustrated in FIG. 2, as seen from a plane, a red region (i.e., a center of emission) can be formed in an approximately tetragonal shape. Referring to graphs shown at an upper side and a side of a light distribution diagram of FIG. 4B, the display apparatus 1 of the present disclosure has a light distribution diagram having a trapezoid shape, and the red region which is the center of emission can be formed between −40 and 40. As a result, in the display apparatus 1 of the present disclosure, it can be seen that an emission area is greater than the display apparatus where the polarizer is installed. This denotes that emission efficiency is better.

FIGS. 5A to 5G are schematic manufacturing process cross-sectional views of a display apparatus according to an embodiment of the present disclosure.

In a display apparatus 1 according to an embodiment of the present disclosure, through a manufacturing process, a first electrode 4 and a reflective metal 10 can be respectively disposed on and under an organic light emitting layer 6, and a light absorbing part 11 for absorbing external light can be provided on an upper surface of the reflective metal 10.

Figure 5A:
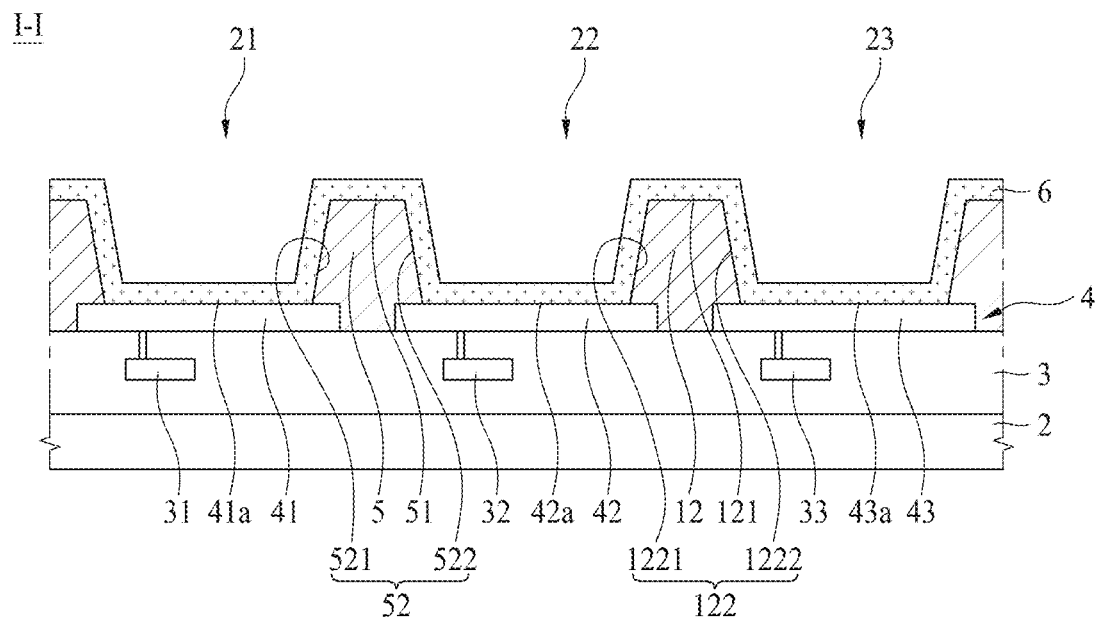
FIGS. 5A to 5G are schematic manufacturing process cross-sectional views of a display apparatus according to an embodiment of the present disclosure.
Figure 5B:
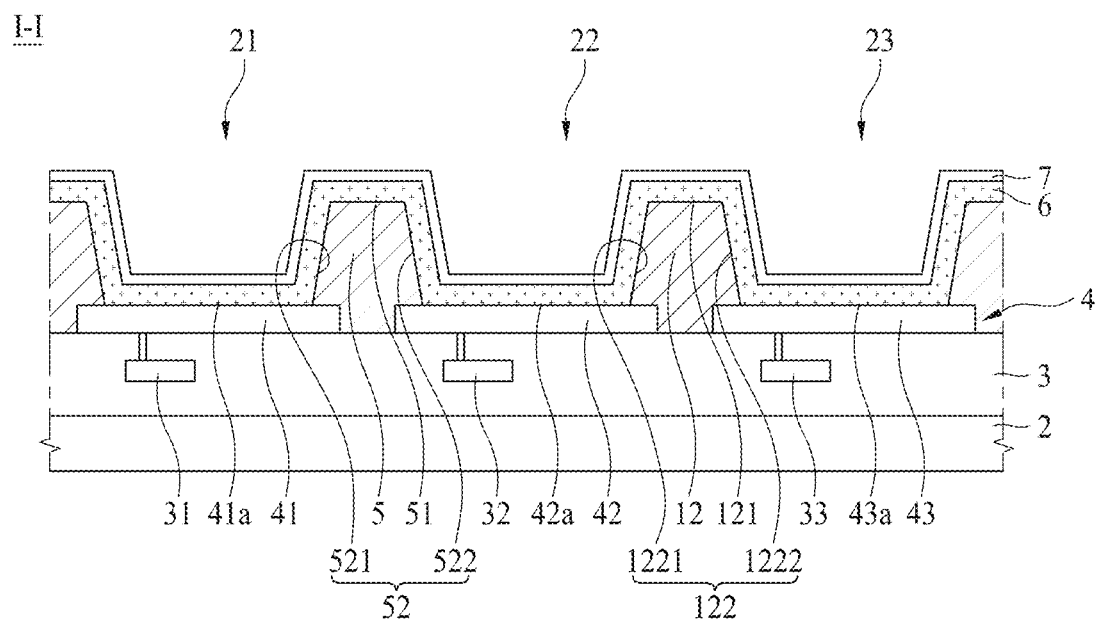
Figure 5C:
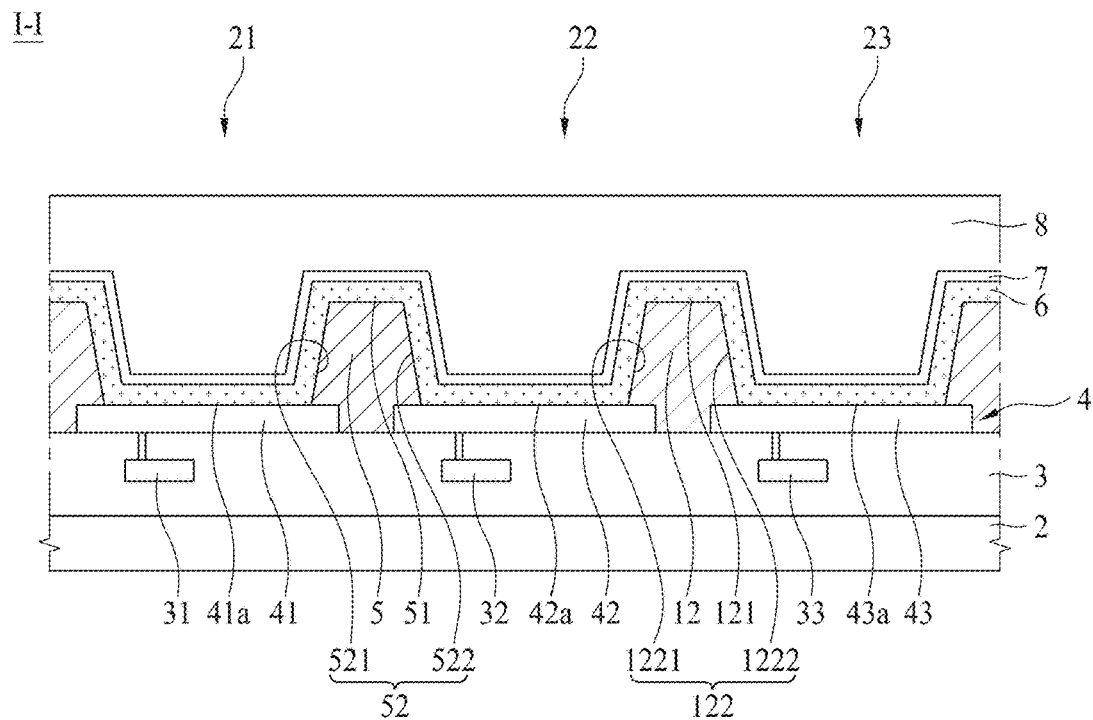

Referring to FIGS. 5A to 5C, in a state where the first electrode 4, a first bank 5, and a second bank 12 are formed on a substrate 2 and a circuit device layer 3, the organic light emitting layer 6 can be blanket-deposited in first to third subpixel 21 to 23, and then, a second electrode 7 can be deposited as a common layer on an upper surface of the organic light emitting layer 6. Here, the organic light emitting layer 6 can emit white light and can be formed in a two-stack structure of a red light emitting layer and a green light emitting layer or a three-stack structure of a red light emitting layer, a green light emitting layer, and a blue light emitting layer. However, the present disclosure is not limited thereto. If the organic light emitting layer 6 is capable of emitting white light, the organic light emitting layer 6 can be formed in another structure. The second electrode 7 can be provided as a transparent electrode for transmitting light.

Subsequently, an encapsulation layer 8 can be blanket-deposited on an upper surface of the second electrode 7 in the first to third subpixels 21 to 23. At this time, an upper surface of the encapsulation layer 8 can be disposed in parallel with each of first to third sub-electrodes 41 to 43.

Figure 5D:
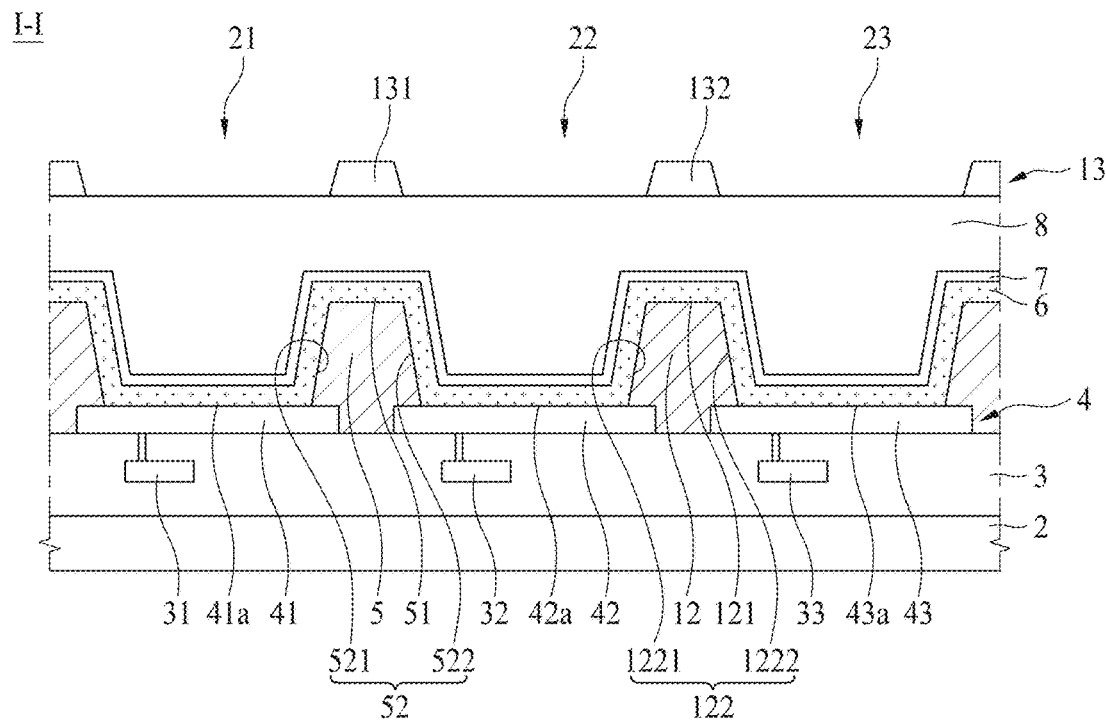

Subsequently, referring to FIG. 5D, a plurality of black matrixes 13 can be disposed on an upper surface of the encapsulation layer 8 to correspond to each of banks. Therefore, each of the black matrixes 13 can be disposed between adjacent subpixels of the subpixels 21 to 23 and can divide regions of the first subpixels 21 to 23. The black matrixes 13 can be blanket-deposited to contact the upper surface of the encapsulation layer 8, and then, can be patterned to be disposed at only an upper side of a bank through an exposure process and an etching process.

Figure 5E:
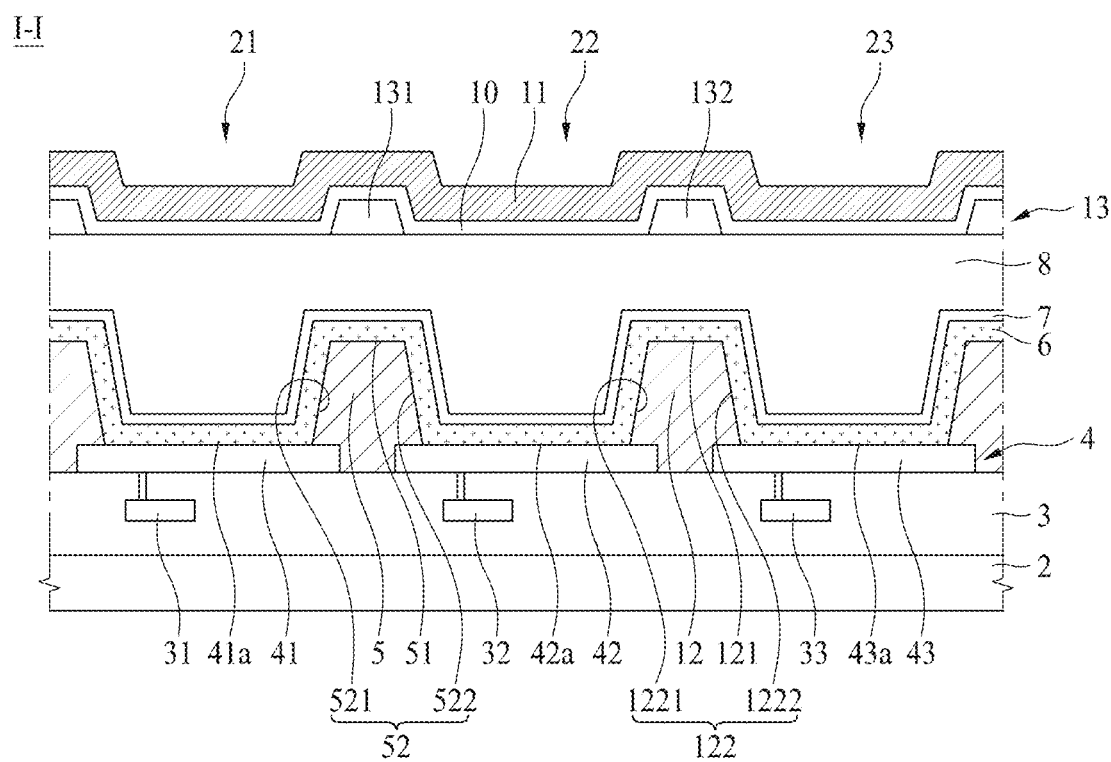

Subsequently, referring to FIG. 5E, the reflective metal 10 and the light absorbing part 11 can be sequentially blanket-deposited to cover the black matrixes 13 and the encapsulation layer 8 disposed between the black matrixes 13. At this time, a thickness of the light absorbing part 11 can be deposited to be thicker than that of the reflective metal 10. The reflective metal 10 can be disposed in parallel with an upper surface of the sub-electrode because the upper surface of the encapsulation layer 8 is disposed in parallel with the upper surface of the sub-electrode.

Figure 5F:
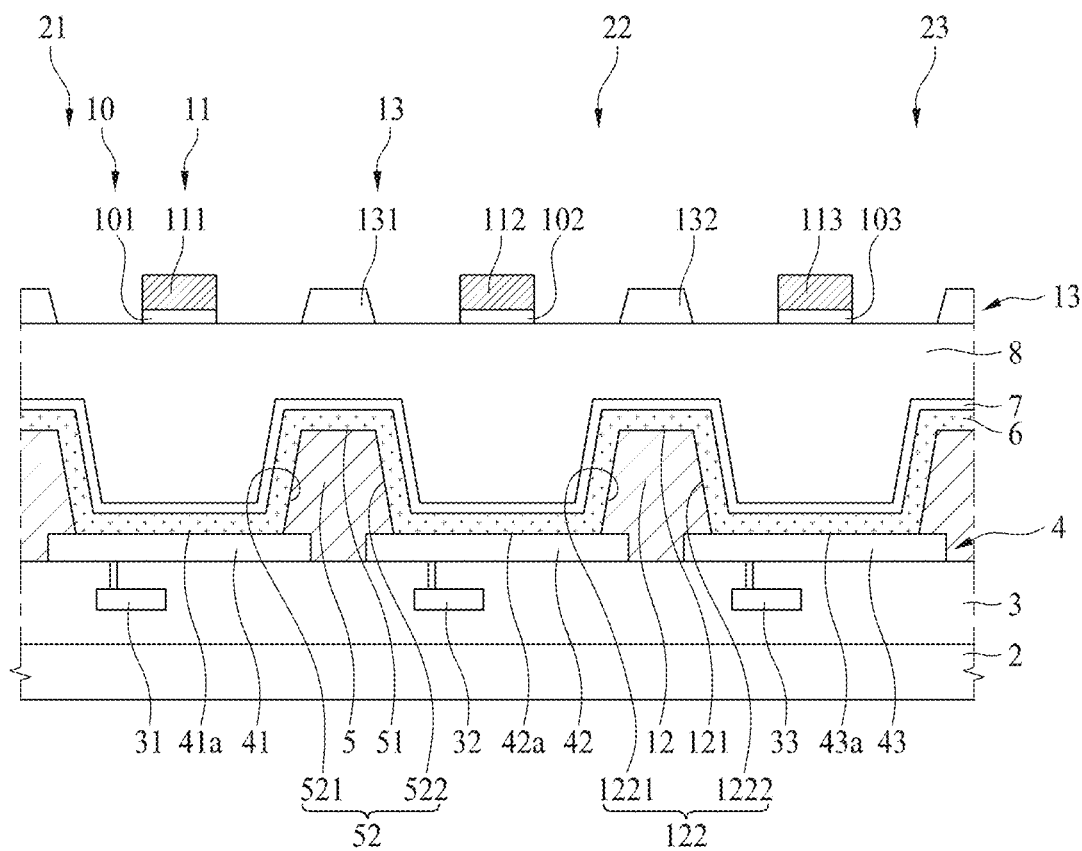

Subsequently, referring to FIG. 5F, the reflective metal 10 and the light absorbing part 11 can be patterned through an exposure process and an etching process so that the reflective metal 10 and the light absorbing part 11 are disposed at only a center of each of the subpixels 21 to 23. The reflective metal 10 and the light absorbing part 11 can be simultaneously patterned, and thus, both ends of the reflective metal 10 can match both ends of the light absorbing part 11. Therefore, a width of the reflective metal 10 can be the same as that of the light absorbing part 11. In this case, a width of the reflective metal 10 can be provided to be less than that of a sub-electrode uncovered by the banks, and light emitted from the organic light emitting layer 6 can be discharged to the outside through reflection and re-reflection by the sub-electrode.

Figure 5G:
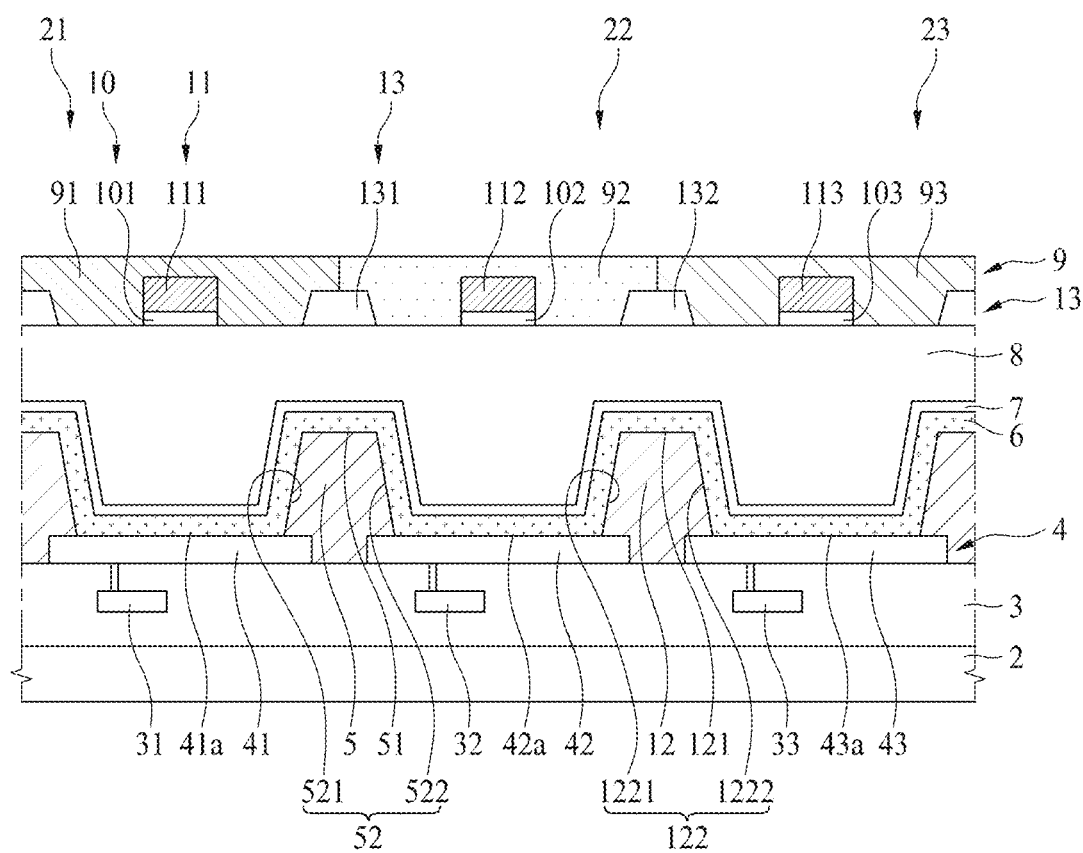

Subsequently, referring to FIG. 5G, first to third color filters 91 to 93 can be deposited to be respectively disposed in the first to third subpixels 21 to 23. The first color filter 91 can be a red color filter emitting red light, the second color filter 92 can be a green color filter emitting green light, and the third color filter 93 can be a blue color filter emitting blue light. The first to third color filters 91 to 93 can be provided to cover the first to third reflective metals 101 to 103 and first to third light absorbing parts 111 to 113, which are respectively patterned in a stacked structure in the first to third subpixels 21 to 23. Accordingly, a portion of a manufacturing process performed on the display apparatus 1 according to an embodiment of the present disclosure can be completed.

As a result, the display apparatus 1 according to an embodiment of the present disclosure can be implemented so that the light absorbing part 11 is disposed at a portion of the color filter layer 9 disposed an outermost portion to decrease an external light reflectance and the light emitted from the organic light emitting layer 6 is reflected and re-reflected through the first electrode 4 (i.e., a reflective electrode) and the reflective metal 10 respectively disposed on and under the organic light emitting layer 6, and thus, emission efficiency can be enhanced compared to a case where a polarizer is installed on an organic light emitting layer.

Figure 6A:
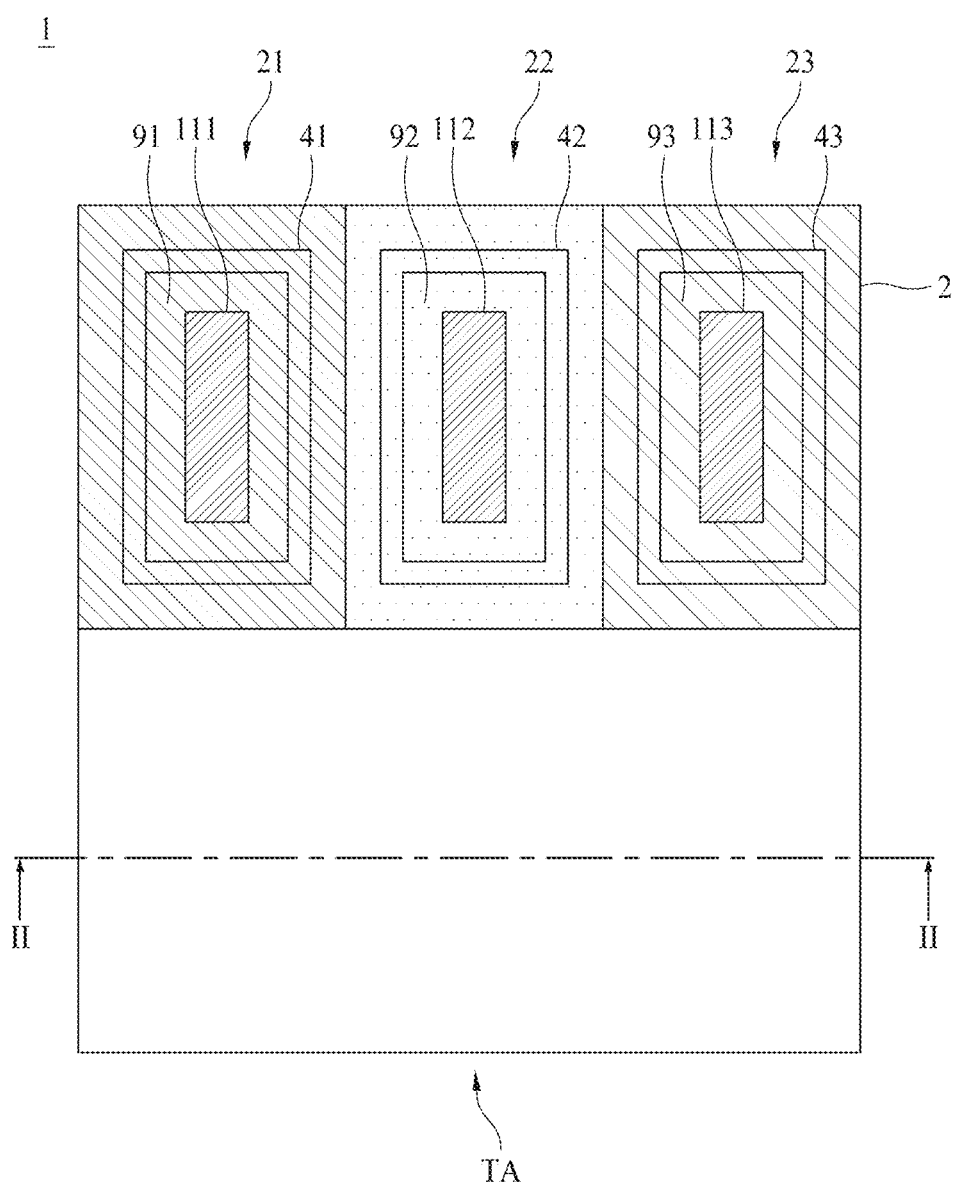
FIG. 6A is a schematic plan view of a display apparatus according to another embodiment of the present disclosure.
Figure 6B:
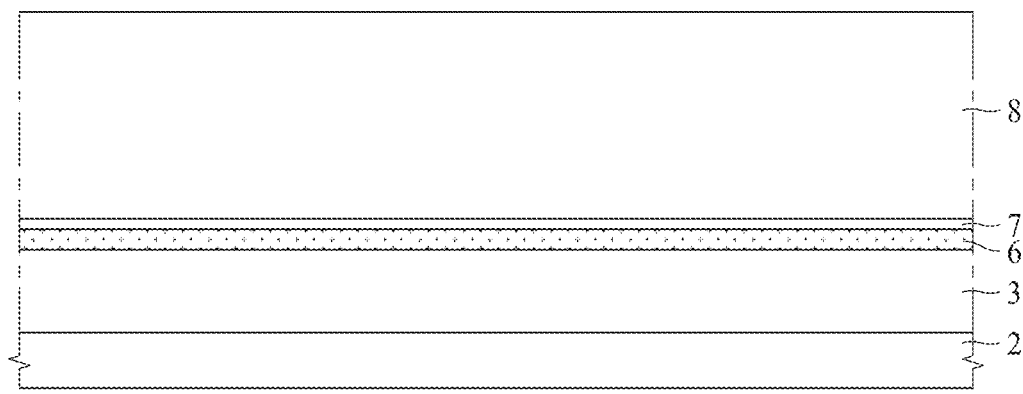
FIG. 6B is a schematic cross-sectional view taken along line II-II illustrated in FIG. 6A.

FIG. 6A is a schematic plan view of a display apparatus according to another embodiment of the present disclosure, and FIG. 6B is a schematic cross-sectional view taken along line II-II illustrated in FIG. 6A.

Referring to FIGS. 6A and 6B, except for that a transparent part TA is disposed adjacent to first to third subpixels 21 to 23, a display apparatus 1 according to another embodiment of the present disclosure is the same as the above-described display apparatus of FIG. 1. Hereinafter, therefore, like reference numerals refer to like elements, and only different elements will be described.

In the above-described display apparatus 1 of FIG. 1, first to third subpixels 21 to 23 can be provided in one pixel, or the first to third subpixels 21 to 23 and a fourth subpixel emitting white light can be provided in one pixel. Therefore, in the display apparatus 1 of FIG. 1, a user located in front of a substrate 2 may not see a thing located behind the substrate 2, and contrariwise, a user located behind the substrate 2 may not see a thing located in front of the substrate 2. That is, a user may not see a thing located behind the display apparatus of FIG. 1. This is because light reflected to a thing located behind a display apparatus (i.e., behind the substrate 2) cannot pass through the display apparatus of FIG. 1. Here, a forward region, where a user is located, in front of the substrate 2 can be a direction from the organic light emitting layer 6 to the color filter layer 9. Accordingly, when a user is located behind the substrate 2, a rearward region behind the substrate 2 can be a direction from the organic light emitting layer 6 to the color filter layer 9, and in this case, the user may not see a thing located in front of the substrate 2.

On the other hand, in the display apparatus according to another embodiment illustrated in FIG. 6A, since the transparent part TA is disposed adjacent to the first to third subpixels 21 to 23, a user disposed opposite to a thing with respect to the substrate 2 can see, through the transparent part TA, a thing located at an opposite position. The transparent part TA can be provided to be transparent so that a thing disposed in front of or behind the substrate 2 is seen.

In more detail, the transparent part TA can include a substrate 2, an organic light emitting layer 6, and a second electrode 7. Since the display apparatus is implemented as the top emission type, the substrate 2 and the second electrode 7 can each include a transparent material. The organic light emitting layer 6 can include a light emitting layer for emitting blue light and yellowish-green light or a light emitting layer for emitting red light, green light, and blue light. However, in the display apparatus according to another embodiment illustrated in FIG. 6A, since a first electrode corresponding to the second electrode 7 is not disposed under the organic light emitting layer 6, an electric field may not be generated, and thus, even when an electric field is generated in each of the first to third subpixels 21 to 23, a user may not see a thing because the light emitting layer does not emit light.

As a result, since the transparent part TA includes the substrate 2 and the second electrode 7 each including a transparent material and the organic light emitting layer 6 where an electric field is not generated, a user located in front of the substrate 2 can see, through the transparent part TA, a thing located behind the substrate 2.

The transparent part TA of the display apparatus according to another embodiment illustrated in FIG. 6A can further include a circuit device layer 3 and an encapsulation layer 8, for decreasing a step height with the organic light emitting layer 6 disposed in each of the first to third subpixels 21 to 23.

A plurality of connection lines for driving at least one of the first to third subpixels 21 to 23 can be provided in the circuit device layer 3 of the transparent part TA. The plurality of connection lines can be respectively connected to the first to third subpixels 21 to 23 adjacent thereto and can transfer a driving signal to at least one of the first to third subpixels 21 to 23.

They encapsulation layer 8 can be thickly provided up to a lower surface or an upper surface of the color filter layer 9 disposed in the first to third subpixels 21 to 23, for preventing particles from penetrating into the transparent part TA.

Therefore, as in FIG. 6B, the display apparatus 1 according to another embodiment of the present disclosure can be provided in a structure where the substrate 2, the circuit device layer 3, the organic light emitting layer 6, the second electrode 7, and the encapsulation layer 8 are sequentially stacked, and thus, a user can see a thing located opposite to the user with respect to the display apparatus 1.

As in FIG. 6B, the transparent part TA of the display apparatus 1 according to another embodiment of the present disclosure can include the substrate 2, the circuit device layer 3, the organic light emitting layer 6, the second electrode 7, and the encapsulation layer 8 which are provided in common in each of the first to third subpixels 21 to 23. This is for that the elements provided in common in each of the first to third subpixels 21 to 23 are provided in the transparent part TA, and thus, a separate manufacturing process is performed for forming the transparent part TA. As a result, in the display apparatus 1 according to another embodiment of the present disclosure, the transparent part TA can be formed without any increase in the number of manufacturing processes performed on the display apparatus of an embodiment of the present disclosure. Elements being provided in common in each of the first to third subpixels 21 to 23 can denote that all of the elements are provided in each of the first to third subpixels 21 to 23 without being patterned for each of the first to third subpixels 21 to 23.

The transparent part TA can be provided to have a size corresponding to a region equal to a sum of sizes of the first to third subpixels 21 to 23 with respect to one pixel, but is not limited thereto.

Herein, an example where the transparent part TA includes the substrate 2, the circuit device layer 3, the organic light emitting layer 6, the second electrode 7, and the encapsulation layer 8 is described, but is not limited thereto. In other embodiments, the transparent part TA can include only the substrate 2 and the encapsulation layer 8.

Figure 6C:
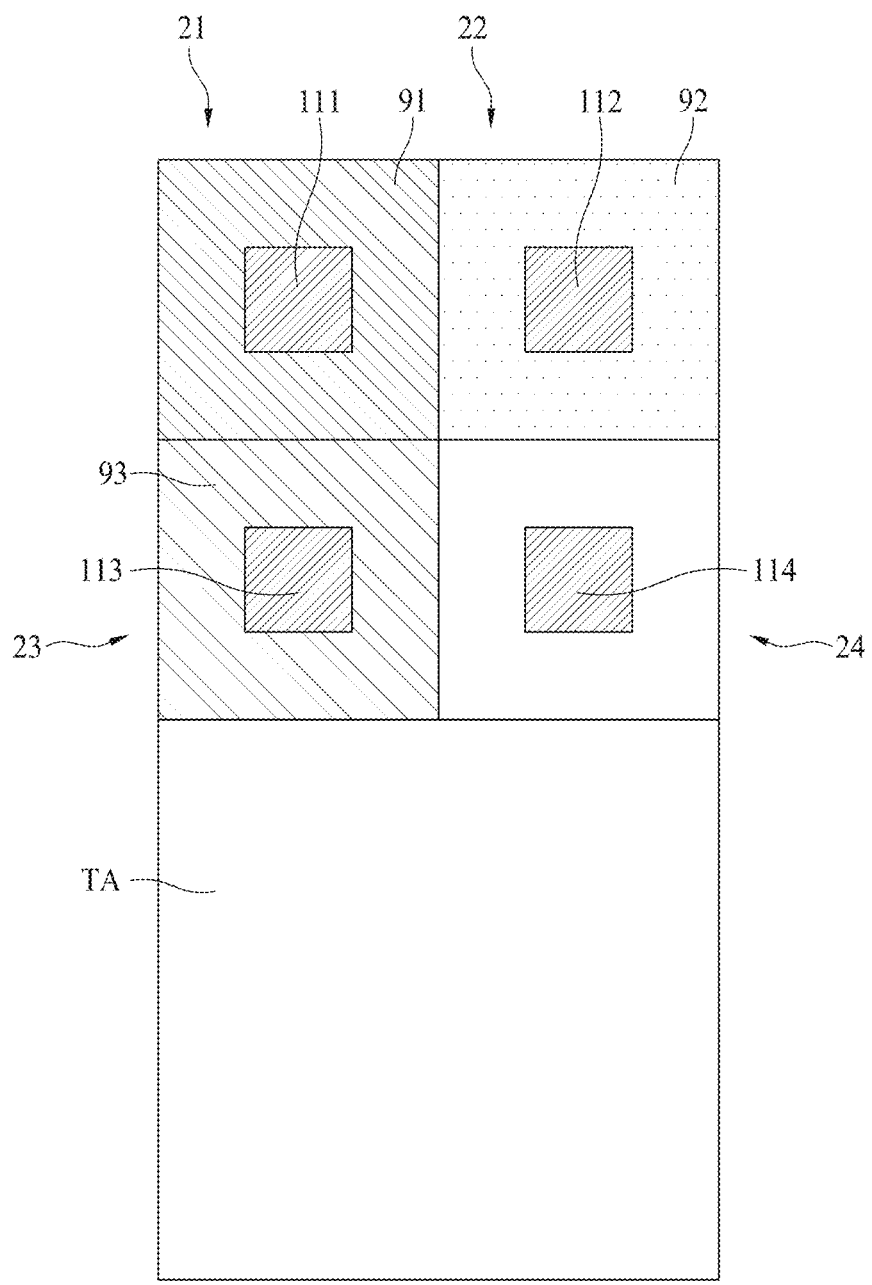
FIG. 6C is a schematic plan view of a display apparatus according to a modified embodiment of the present disclosure.

FIG. 6C is a schematic plan view of a display apparatus according to a modified embodiment of the present disclosure.

In the display apparatus of FIG. 6A, one pixel can include a first subpixel 21, a second subpixel 22, a third subpixel 23, and a transparent part TA, and the transparent part TA can be disposed adjacent to each of the first subpixel 21, the second subpixel 22, and the third subpixel 23 which are arranged in one row.

On the other hand, in the display apparatus of FIG. 6C, one pixel can include a first subpixel 21, a second subpixel 22, a third subpixel 23, a fourth subpixel 24, and a transparent part TA, the first and second subpixels 21 and 22 can be disposed at an upper portion in the pixel, the third and fourth subpixels 23 and 24 can be disposed under the first and second subpixels 21 and 22, and the transparent part TA can be disposed under the third and fourth subpixels 23 and 24. Also, since the fourth subpixel 24 is provided to emit white light, a color filter can be provided in the fourth subpixel 24. Therefore, a color filter may not be disposed in one of subpixels adjacent to the transparent part TA. If a color filter is not provided, a transmittance of light emitted from an organic light emitting layer can be more enhanced than a case where a color filter is provided.

Moreover, even in a case where the third and fourth subpixels 23 and 24 are disposed upward than the first and second subpixels 21 and 22 without being adjacent to the transparent part TA with reference to FIG. 6C, when another pixel having the above-describe type is disposed under the transparent part TA, the transparent part TA can be adjacent to a fourth subpixel of another pixel, and thus, a color filter may not be provided in one of two subpixels adjacent to the transparent part TA.

In FIG. 6C, an example where the transparent part TA is disposed adjacent to the third and fourth subpixels 23 and 24 is described, but is not limited thereto. In other embodiments, the transparent part TA can be disposed adjacent to one of the fourth subpixel 24 and the first and second subpixels 21 and 22. That is, the transparent part TA can be disposed adjacent to the fourth subpixel 24 and the first subpixel 21 or the fourth subpixel 24 and the second subpixel 22.

As in FIGS. 6A and 6C, the display apparatus 1 according to another embodiment of the present disclosure can be provided as various types where a first pixel includes a transparent part TA.

To sum up, in the display apparatus 1 according to another embodiment of the present disclosure, one pixel can include a first subpixel 21, a second subpixel 22, a third subpixel 23, and a transparent part TA, or one pixel can include a first subpixel 21, a second subpixel 22, a third subpixel 23, a fourth subpixel 24, and a transparent part TA, whereby a user can see, through the transparent part TA, a thing disposed opposite to the user. Accordingly, the display apparatus 1 according to another embodiment of the present disclosure can be applied to a flexible display, and particularly, can be applied to a transparent display including no polarizer.

The display apparatus 1 according to another embodiment of the present disclosure can correspond to a case where a transparent part TA is applied to the display apparatus according to an embodiment of the present disclosure, and thus, a transparent display can be implemented even without a polarizer, thereby more enhancing a transmittance. In more detail, a polarizer may not be provided on or under the transparent part TA, and thus, a transmittance can be enhanced by 50% or more compared to a case which includes a polarizer.

Moreover, a polarizer may not be provided at any one of an upper portion and a lower portion of each of the first to third subpixels 21 to 23, and thus, luminance can be prevented from being reduced compared to a case which includes a polarizer, thereby enhancing the emission efficiency of each of the first to third subpixels 21 to 23. As a result, the display apparatus 1 according to another embodiment of the present disclosure can configure a transparent display with enhanced transmittance and emission efficiency.

Figure 7A:
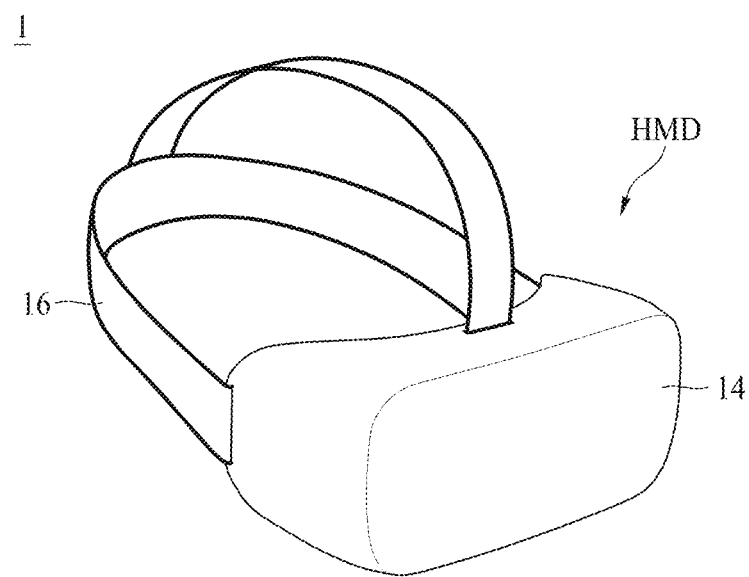
FIGS. 7A to 7C relate to a display apparatus according to another embodiment of the present disclosure and relate to a head-mounted display (HMD).
Figure 7B:
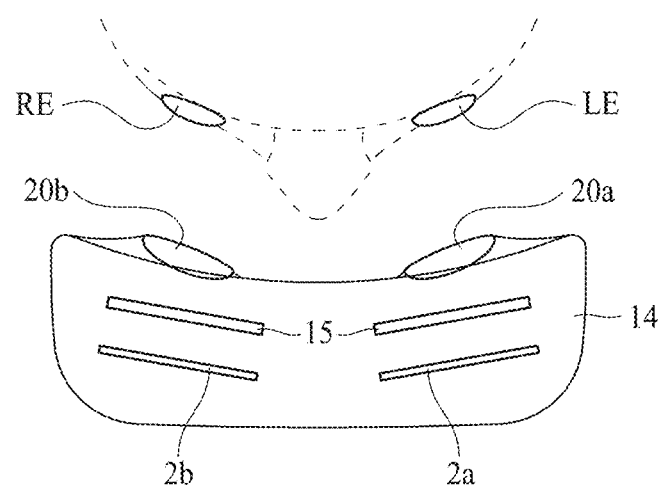
Figure 7C:
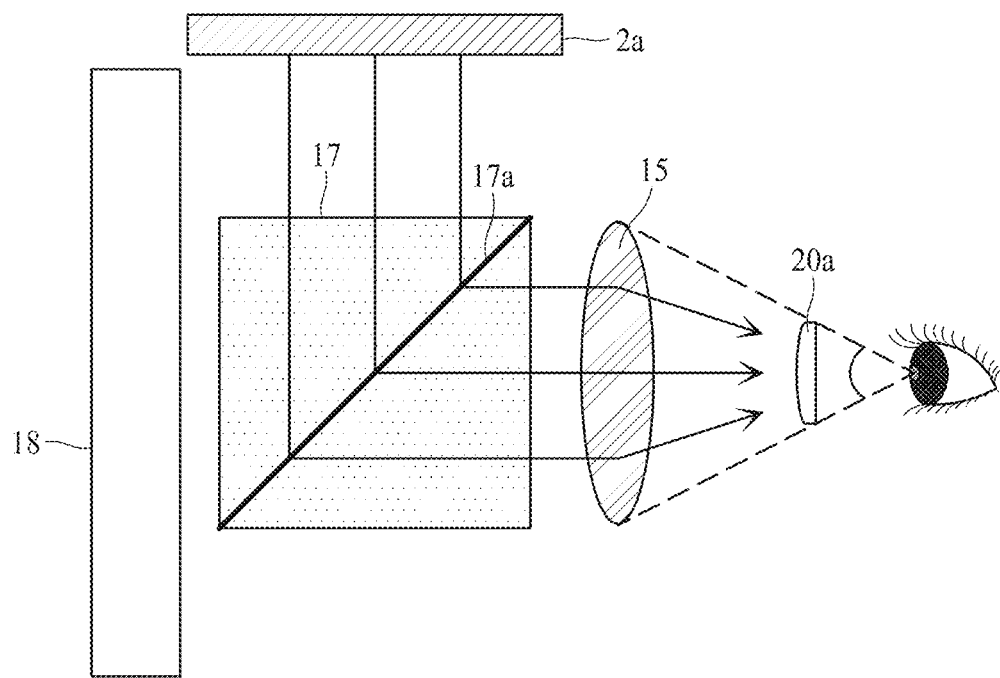

FIGS. 7A to 7C relate to an electroluminescent display apparatus according to another embodiment of the present disclosure and relate to a head-mounted display (HMD) apparatus. FIG. 7A is a schematic perspective view, FIG. 7B is a schematic plan view of a virtual reality (VR) structure, and FIG. 7C is a schematic cross-sectional view of an augmented reality (AR) structure.

As seen in FIG. 7A, the HMD apparatus according to the present disclosure can include an accommodating case 14 and a head-mounted band 16.

The accommodating case 14 can accommodate elements such as a display apparatus, a lens array, and an eyepiece lens.

The head-mounted band 16 can be fixed to the accommodating case 14. The head-mounted band 16 is illustrated as being provided to surround an upper surface of both side surfaces of a user, but is not limited thereto. The head-mounted band 16 can fix the HMD apparatus to a head of a user and can be replaced by a glasses frame type structure or a helmet type structure.

As seen in FIG. 7B, an HMD apparatus 1 having the VR structure according to the present disclosure can include a left-eye display apparatus 2a, a right-eye display apparatus 2b, a lens array 15, a left-eye eyepiece lens 20a, and a right-eye eyepiece lens 20b.

The left-eye display apparatus 2a, the right-eye display apparatus 2b, the lens array 15, the left-eye eyepiece lens 20a, and the right-eye eyepiece lens 20b can be accommodated into the accommodating case 14.

The left-eye display apparatus 2a and the right-eye display apparatus 2b can display the same image, and in this case, a user can watch a three-dimensional (3D) image. Alternatively, the left-eye display apparatus 2a can display a left-eye image, and the right-eye display apparatus 2b can display a right-eye image. Each of the left-eye display apparatus 2a and the right-eye display apparatus 2b can be configured as the display apparatus of each of FIGS. 1 to 6A. For example, each of the left-eye display apparatus 2a and the right-eye display apparatus 2b can be an organic light emitting display apparatus.

Each of the left-eye display apparatus 2a and the right-eye display apparatus 2b can include a plurality of subpixels, a circuit device layer 3, a first electrode 4, a first bank 5, an organic light emitting layer 6, a second electrode 7, an encapsulation layer 8, a color filter layer 9, a reflective metal 10, a light absorbing part 11, a second bank 12, and a black matrix 13 and can combine colors of lights emitted from the subpixels on the basis of various manners to display various images.

The lens array 15 can be spaced apart from each of the left-eye eyepiece lens 20a and the left-eye display apparatus 2a and can be provided between the left-eye eyepiece lens 20a and the left-eye display apparatus 2a. That is, the lens array 15 can be disposed in front of the left-eye eyepiece lens 20a and behind the left-eye display apparatus 2a. Also, the lens array 15 can be spaced apart from each of the right-eye eyepiece lens 20b and the right-eye display apparatus 2b and can be provided between the right-eye eyepiece lens 20b and the right-eye display apparatus 2b. That is, the lens array 15 can be disposed in front of the right-eye eyepiece lens 20b and behind the right-eye display apparatus 2b.

The lens array 15 can be a micro-lens array. The lens array 15 can be replaced by a pin hole array. By using the lens array 15, an image displayed by the left-eye display apparatus 2a or the right-eye display apparatus 2b can be zoomed in by a certain magnification, and thus, a zoomed-in image can be seen by a user.

A left eye LE of a user can be located at the left-eye eyepiece lens 20a, and a right eye RE of the user can be located at the right-eye eyepiece lens 20b.

As seen in FIG. 7C, an HMD apparatus having the AR structure according to the present disclosure can include a left-eye display apparatus 2a, a lens array 15, a left-eye eyepiece lens 20a, a transmissive reflection part 17, and a transmissive window 18. In FIG. 7C, for convenience, only left-eye elements are illustrated, and right-eye elements can be the same as the left-eye elements.

The left-eye display apparatus 2a, the lens array 15, the left-eye eyepiece lens 20a, the transmissive reflection part 17, and the transmissive window 18 can be accommodated into the accommodating case 14.

The left-eye display apparatus 2a can be disposed in one side (for example, an upper side) of the transmissive reflection part 17 without covering the transmissive window 18. Therefore, the left-eye display apparatus 2a can provide an image to the transmissive reflection part 17 without covering an external background seen through the transmissive window 18.

The left-eye display apparatus 2a can be configured as the electroluminescent display apparatus of each of FIGS. 1 to 6A. In this case, in FIGS. 1 to 6A, an upper portion (for example, a color filter layer 9) corresponding to a surface displaying an image can face the transmissive reflection part 17.

The lens array 15 can be provided between the left-eye eyepiece lens 20a and the transmissive reflection part 17.

The left eye of the user can be located at the left-eye eyepiece lens 20a.

The transmissive reflection part 17 can be disposed between the lens array 15 and the transmissive window 18. The transmissive reflection part 17 can include a reflection surface 17a which transmits a portion of light and reflects the other portion of the light. The reflection surface 17a can be provided so that an image displayed by the left-eye display apparatus 2a travels to the lens array 15. Accordingly, the user can see, through the transmissive window 18, all of the external background and the image displayed by the left-eye display apparatus 2a. That is, the user can see one image which includes a real background and a virtual image, and thus, AR can be implemented.

The transmissive window 18 can be disposed in front of the transmissive reflection part 17.

The display apparatus according to the present disclosure can be implemented so that a light absorbing part is disposed at a portion of a color filter to decrease an external light reflectance and a reflective electrode and a reflective metal respectively disposed on and under an organic light emitting layer reflects and re-reflects light, thereby more enhancing emission efficiency than a case where a polarizer is installed on the organic light emitting layer.

The above-described feature(s), structure(s), and effect(s) of the present disclosure are included in at least one embodiment of the present disclosure, but are not limited to only one embodiment. Furthermore, the feature(s), structure(s), and effect(s) described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   a substrate including a first subpixel and a second subpixel;
   a first electrode on the substrate, and including a first sub-electrode provided in the first subpixel and a second sub-electrode provided in the second subpixel;
   an organic light emitting layer on the first electrode;
   a second electrode on the organic light emitting layer;
   a first bank between the first sub-electrode and the second sub-electrode, the first bank dividing the first subpixel and the second subpixel;
   a color filter layer on the second electrode;
   a reflective metal layer disposed in the color filter layer, two or more sides of the reflective metal layer being surrounded by the color filter layer; and
   a light absorbing part on an upper surface of the reflective metal layer, the light absorbing part absorbing light,
   wherein the first electrode is provided as a reflective electrode, and the first electrode is separate from the reflective metal layer,
   the organic light emitting layer is disposed between the reflective electrode and the reflective metal layer, and
   the reflective metal layer overlaps the first electrode in the thickness direction of the substrate.

2. The display apparatus of claim 1, wherein
   the color filter layer comprises a first color filter disposed to correspond to the first subpixel,
   the reflective metal layer comprises a first reflective metal part disposed in the first color filter, and
   the light absorbing part comprises a first light absorbing part disposed on an upper surface of the first reflective metal part.

3. The display apparatus of claim 2, wherein a width of the first light absorbing part is the same as a width of the first reflective metal part.

4. The display apparatus of claim 2, wherein a thickness of the first reflective metal part is thinner than a thickness of the first light absorbing part.

5. The display apparatus of claim 2, wherein the first color filter is provided to cover the first light absorbing part and the first reflective metal part.

6. The display apparatus of claim 2, wherein the first reflective metal part is provided to face the first sub-electrode.

7. The display apparatus of claim 6, wherein a width of the first reflective metal part is less than a width of the first sub-electrode contacting the organic light emitting layer, and
   wherein the width of the first reflective metal part is less than a width of the first color filter.

8. The display apparatus of claim 2, wherein the first light absorbing part is provided as N number or more in the first color filter in an area overlapping with the first sub-electrode, where N is an integer greater than zero.

9. The display apparatus of claim 2, wherein
   the color filter layer comprises a second color filter disposed to correspond to the second subpixel,
   the reflective metal layer comprises a second reflective metal part disposed in the second color filter,
   the light absorbing part comprises a second light absorbing part disposed on an upper surface of the second reflective metal part,
   the first reflective metal part is spaced apart from the second reflective metal part, and
   the first light absorbing part is spaced apart from the second absorbing part.

10. The display apparatus of claim 1, further comprising a first black matrix preventing color mixture between the first subpixel and the second subpixel,
    wherein the color filter layer comprises a first color filter disposed to correspond to the first subpixel and a second color filter disposed to correspond to the second subpixel, and
    the first black matrix is disposed between the first color filter and the second color filter.

11. The display apparatus of claim 10, wherein the first black matrix is disposed to correspond to the first bank.

12. The display apparatus of claim 1, further comprising an encapsulation layer disposed between the second electrode and the color filter layer,
    wherein the reflective metal layer contacts an upper surface of the encapsulation layer, and
    the light absorbing part is spaced apart from the encapsulation layer.

13. The display apparatus of claim 1, wherein
    the substrate comprises a third subpixel adjacent to one side of the second subpixel,
    the first electrode comprises a third sub-electrode provided on the substrate and in the third subpixel,
    the color filter layer comprises a first color filter disposed to correspond to the first subpixel, a second color filter disposed to correspond to the second subpixel, and a third color filter disposed to correspond to the third subpixel, and
    the first color filter, the second color filter, and the third color filter are respectively provided as a red color filter, a green color filter, and a blue color filter.

14. The display apparatus of claim 13, further comprising:
    a second bank disposed between the second sub-electrode and the third sub-electrode to divide the second subpixel and the third subpixel; and
    a second black matrix disposed between the second color filter and the third color filter,
    wherein the second black matrix is disposed to correspond to the second bank.

15. The display apparatus of claim 1, wherein the organic light emitting layer is provided to emit white light.

16. The display apparatus of claim 13, further comprising a transparent part provided to be transparent so that an item located in front of or behind the substrate is seen through the transparent part,
   wherein the transparent part is disposed adjacent to each of the first subpixel, the second subpixel, and the third subpixel.

17. The display apparatus of claim 16, wherein the transparent part comprises the substrate, the organic light emitting layer, and the second electrode.

18. The display apparatus of claim 13, further comprising a transparent part provided to be transparent so that a thing located in front of or behind the substrate is seen through the transparent part,
   wherein the substrate comprises a fourth subpixel adjacent to one side of the third subpixel,
   the fourth subpixel is provided to emit white light, and
   the transparent part is disposed adjacent to the fourth subpixel and at least one of the first subpixel, the second subpixel, and the third subpixel.

19. The display apparatus of claim 18, wherein a color filter is provided in the first subpixel, the second subpixel, and the third subpixel among the first subpixel, the second subpixel, the third subpixel, and the fourth subpixel.

20. The display apparatus of claim 19, further comprising:
   a lens array spaced apart from the substrate; and
   an accommodating case accommodating the substrate and the lens array.

* * * * *